United States Patent
Fukai et al.

(10) Patent No.: US 6,264,061 B1
(45) Date of Patent: Jul. 24, 2001

(54) ELECTRONIC COMPONENT SUPPLY APPARATUS

(75) Inventors: Kikuji Fukai; Koji Saito; Taro Yasuda; Yutaka Aikawa, all of Tokyo (JP)

(73) Assignee: Taiyo Yuden Co., LTD, Tokyo (JP)

( * ) Notice: Subject to any disclaimer, the term of this patent is extended or adjusted under 35 U.S.C. 154(b) by 0 days.

(21) Appl. No.: 09/243,790

(22) Filed: Feb. 3, 1999

(30) Foreign Application Priority Data

Feb. 3, 1998 (JP) .................................................. 10-022331

(51) Int. Cl.$^7$ ................................ B23Q 7/12; B65H 9/00
(52) U.S. Cl. ........................... 221/171; 221/200; 221/236
(58) Field of Search ..................................... 221/164, 171, 221/172, 190, 200, 236

(56) References Cited

U.S. PATENT DOCUMENTS

| | | | | |
|---|---|---|---|---|
| 4,457,451 | * | 7/1984 | Ichikawa | 221/190 X |
| 4,721,230 | * | 1/1988 | McKnight | 221/173 X |
| 4,979,640 | * | 12/1990 | Konishi et al. | 221/172 X |
| 5,337,465 | * | 8/1994 | Tamaki et al. | 29/740 |
| 5,853,108 | * | 12/1998 | Ando et al. | 221/163 X |
| 5,934,505 | * | 8/1999 | Shimada | 221/236 |
| 6,062,423 | * | 5/2000 | Saito et al. | 221/236 X |

FOREIGN PATENT DOCUMENTS 6-232596   8/1994   (JP) .

* cited by examiner

*Primary Examiner*—Christopher P. Ellis
*Assistant Examiner*—Gene O. Crawford
(74) *Attorney, Agent, or Firm*—Lowe Hauptman Gilman & Berner, LLP

(57) ABSTRACT

A supply apparatus for prism-shaped chip components has two relatively movable taking-in members. When the members move relative to each other, flat surfaces thereof contact each other and a parallel space is formed between the upper portions of the two taking-in members. Relative movement of the two talking-in members causes the components in a storage chamber to enter the parallel space between the upper portions of the two taking-in members. The components entering the parallel space have the same thickness-wise orientation and are lengthwise in a supply passageway in a one by one in a state. The components move downward by gravity in the supply passageway and then in a discharge passageway.

47 Claims, 17 Drawing Sheets

Fig. 3 (A)
Fig. 3 (B)
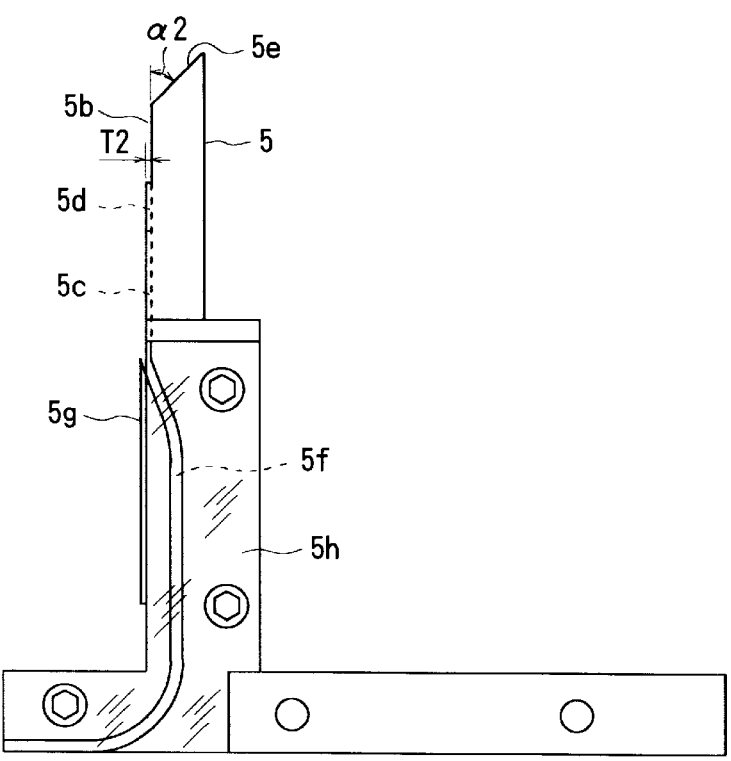
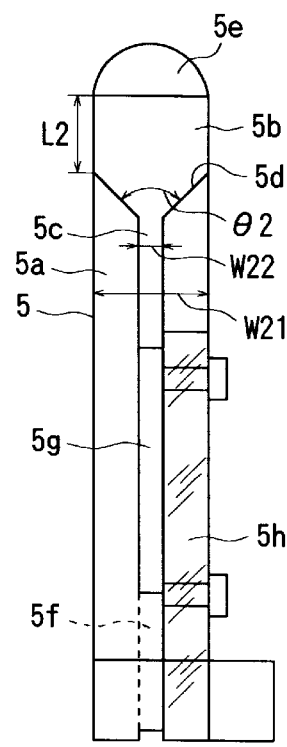
Fig. 3 (C)
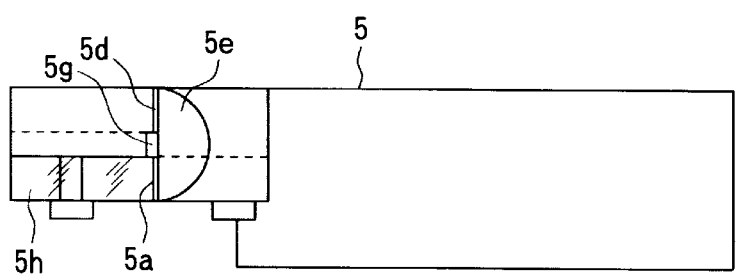

ELECTRONIC COMPONENT SUPPLY APPARATUS

BACKGROUND OF THE INVENTION

1. Field of the Invention

The present invention relates to an electronic component supply apparatus, which supplies prism-shaped electronic components stored within a storage chamber in a bulk state by arranging them in a prescribed direction.

2. Description of the Related Art

Japanese Patent Application Laid-Open No. Hei 6-232596 discloses an apparatus, which supplies electronic components stored within a storage chamber by arranging them in a prescribed direction.

This apparatus is equipped with a storage box for storing a large number of chip components in a bulk state, a taking-in pipe vertically movably disposed in a bottom of the storage box, and a conveyance pipe disposed inside the taking-in pipe. When vertically moving the taking-in pipe by a lever mechanism, the chip components within the storage box are taken lengthwise into the taking-in pipe one by one, whereupon the chip components taken in the taking-in pipe are moved downward within the conveyance pipe by their own weight in a state of their being oriented in the same lengthwise direction.

The above-described apparatus is suited for supplying column-shaped components but is very unsuitable for supplying prism-shaped chip components.

Namely, in a case where supplying prism-shaped chip components, when these chip components are taken into the taking-in pipe and when the chip components are moved in the conveyance pipe by their own weight, it is necessary to make four side surfaces of the chip components other than both end surfaces in the lengthwise direction of it the same direction. However, said apparatus cannot make such a posture control, it is not possible to make the posture of the chip components taken in the taking-in pipe and the posture of the chip components moved in the conveyance pipe by its own weight the same direction.

With even said apparatus, if making the cross-sectional configuration of the inner holes of the taking-in pipe and conveyance pipe conform to the configuration of the end surface of the prism-shaped chip component, when the chip component is taken into the taking-in pipe and when the chip component is moved in the conveyance pipe by its own weight, controlling the posture of the chip component is possible if theoretically.

However, in said apparatus wherein the taking-in pipe is moved vertically on the outer side of the conveyance pipe, even if the cross-sectional configuration of the respective inner holes of the taking-in pipe and conveyance pipe has been conformed to the configuration of the end surface of the prism-shaped chip component, it is very difficult, in actuality, to cause the prism-shaped component to be taken into the taking-in pipe. As a result, there occurs the inconvenience that the supply of the chip components will be often interrupted due to a decrease in the taking-in probability.

Among others, in recent years, because of a demand to speed up the loading of the components onto a circuit board and the inserting of the components into accommodation recessed portions of a component wrapping tape respectively, there has been demanded the electronic component supply apparatus having a supplying performance capable of satisfying such a speed-up demand.

SUMMARY OF THE INVENTION

An object of the present invention is to provide a novel electronic component supply apparatus which can perform stably and successively the operation of supplying prism-shaped electronic components stored within a storage chamber in a bulk state by arranging each of them in a prescribed direction.

To achieve the above object, an electronic component supply apparatus of the present invention comprises a storage chamber for storing prism-shaped electronic components each having a prescribed width, thickness and length in a bulk state; two taking-in members upper ends of which are directed to the interior of the storage chamber, said two taking-in members being disposed at a bottom of the storage chamber in a state where flat surfaces thereof are in contact with each other and are relatively movable; a recessed portion formed in the flat surface of at least one of the taking-in members, said recessed portion forming a parallel space between the upper portions of the two taking-in members at the time of relative movements, said parallel space having a clearance larger than the thickness of one electronic component and smaller than a total sum of the thicknesses of two electronic components; and a groove formed in the flat surface of at least one of the taking-in members, said grove forming a supply passageway between the two taking-in members so as to be communicated with the parallel space, said supply passageway having a rectangular cross section conforming to the configuration of an end surface of the electronic component According to this apparatus, by causing relative movement of the two taking-in members having their flat surfaces kept in contact with each other, the prism-shaped electronic components stored within a storage chamber can be entered into the parallel space between the upper portions of the two taking-in members in a state where the thicknesswise directions thereof are equally arranged. Then, the electronic components which have been entered into the parallel space can be taken lengthwise into the supply passageway one by one in a state where the thicknesswise direction and the widthwise direction are made the same and can be moved downward by their own weight.

Since the electronic components stored in the storage chamber is entered into the parallel space between the upper portions of the two taking-in members in a state where the thicknesswise directions thereof are equally arranged and then the electronic components which have been entered into the parallel space are taken lengthwise into the supply passageway one by one in a state where the thicknesswise direction and the widthwise direction are made the same, it is possible to enhance the probability that the prism-shaped electronic components will be taken with a prescribed posture into the supply passageway. As a result, it is possible to perform stably and successively the operation of supplying the prism-shaped electronic components stored in the storage chamber by orienting each of them in a prescribed direction.

Also, an electronic component supply apparatus of the present invention comprises a storage chamber for storing prism-shaped electronic components each having a prescribed width, thickness and length in a bulk state; two taking-in members upper ends of which are directed to the interior of the storage chamber, said two taking-members being disposed at a bottom of the storage chamber in a state where flat surfaces thereof oppose each other through a gap therebetween in parallel with each other; a spacer disposed relatively movably between the flat surfaces of the two taking-in members, said spacer forming a parallel space between the upper portions of the two taking-in members at the time of relative movements, said parallel space having a clearance larger than the thickness of one electronic component and smaller than a total sum of the thicknesses of two electronic components; and a slit formed in the spacer, said slit forming a supply passageway between the two taking-in members so as to be communicated with the parallel space, said supply passageway having a rectangular cross section conforming to the configuration of an end surface of the electronic component.

According to this apparatus, by causing relative movement of the spacer between the two taking-in members, the prism-shaped erecronic components stored within a storage chamber can be entered into the parallel space between the upper portions of the two taking-in members in a state where the thicknesswise directions thereof are equally arranged. Then, the electronic components which have been entered into the parallel space can be taken lengthwise into the supply passageway one by one in a state where the thicknesswise direction and the widthwise direction are made the same and can be moved downward by their own weight.

Since the electronic components stored in the storage chamber is entered into the parallel space between the upper portions of the two taking-in members in a state where the thicknesswise directions thereof are equally arranged and then the electronic components which have been entered into the parallel space are taken lengthwise into a supply passageway one by one in a state where the thicknesswise direction and the widthwise direction are made the same, it is possible to enhance the probability that the prism-shaped electronic components will be taken with a prescribed posture into the supply passageway. As a result, it is possible to perform stably and successively the operation of supplying the prism-shaped electronic components stored in the storage chamber by orienting each of them in a prescribed direction.

The above and other objects, features and advantages of the present invention will become apparent from the following description and accompanying drawings.

BRIEF DESCRIPTION OF THE DRAWINGS

FIG. 3(A) is a side view of a second taking-in member illustrated in FIG. 1, FIG. 3(B) is a front view thereof, and FIG. 3(C) is a top view thereof;

DESCRIPTION OF THE PREFERRED EMBODIMENTS

Figure 1:
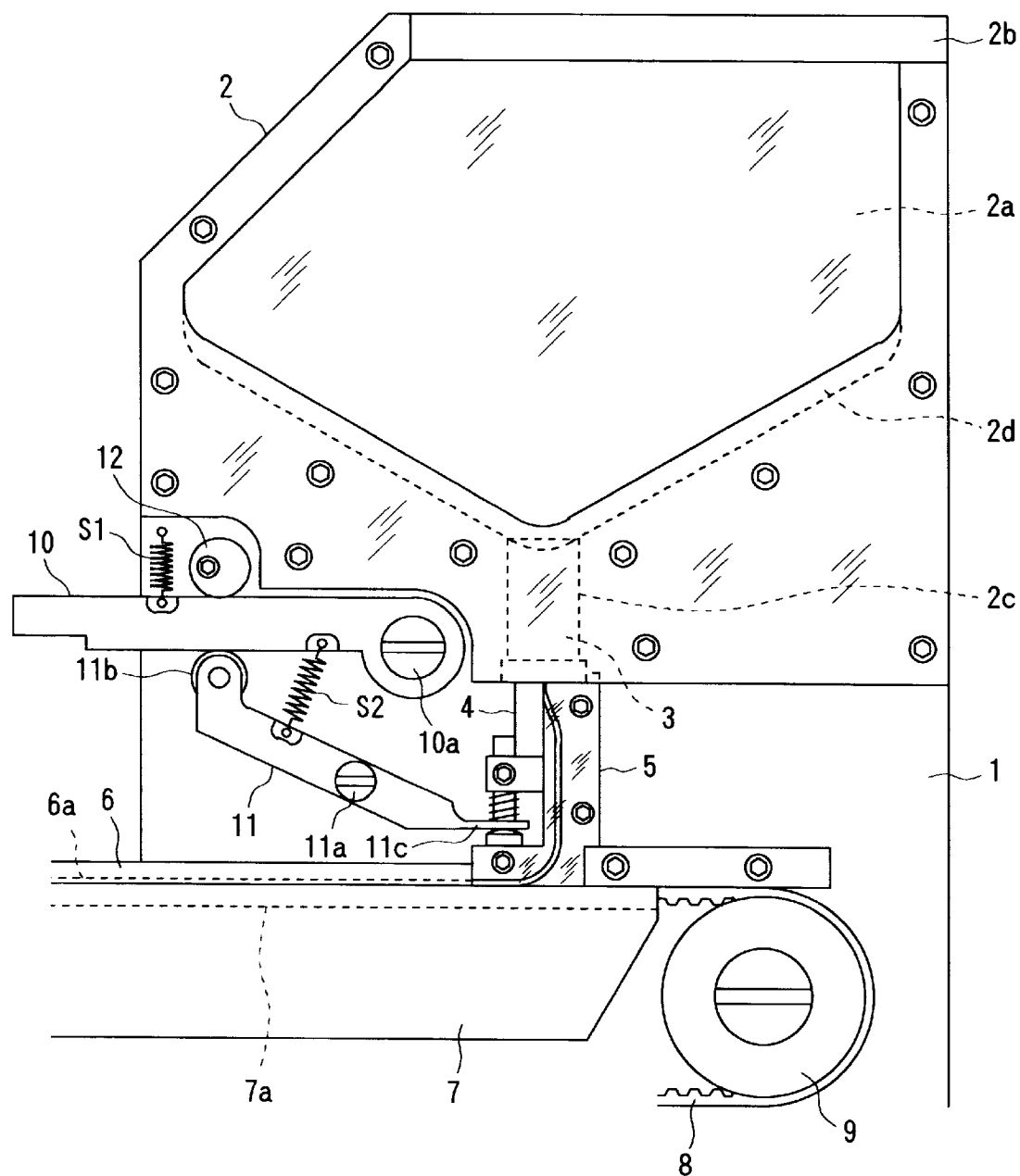
FIG. 1 is a side view of an electronic component supply apparatus according to a first embodiment of the present invention.
Figure 2:
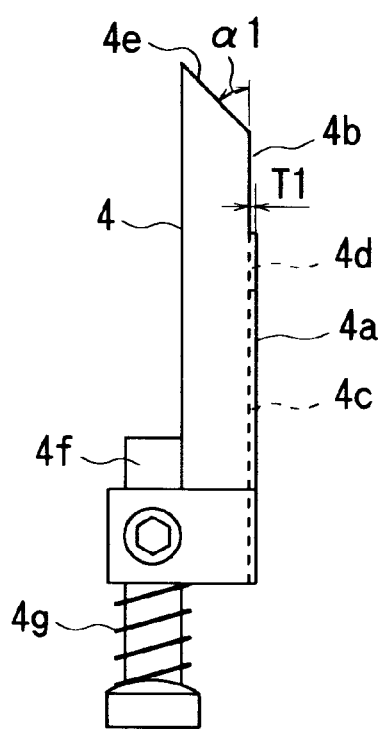
FIG. 2(A) is a side view of a first taking-in member illustrated in FIG. 1.
FIG. 2(B) is a front view thereof.
FIG. 2(C) is a top view thereof.
Figure 2:
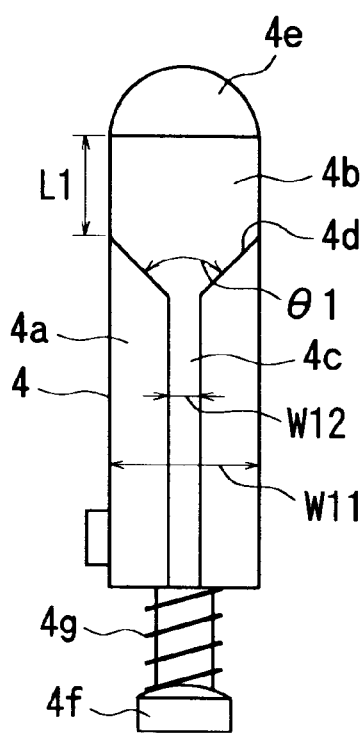
Figure 2:
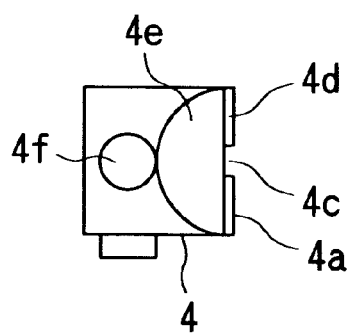

FIGS. 1 to 9 are illustrations of a first embodiment of the present invention. In FIGS. 1 to 9, reference numerals 1 denotes a frame, 2 denotes a storage housing, 3 denotes a bush, 4 denotes a first taking-in member, 5 denotes a second taking-in member, 6 denotes a component guide, 7 denotes a belt guide, 8 denotes a pulley, 9 denotes an operation lever and 10 denotes a drive lever.

The storage housing 2 has a storage chamber 2a top of which is open, a lid plate 2b for freely openably closing the top opening of the storage chamber 2a, and a circular through hole 2c which is formed in a V letter inclined bottom surface 2d of the storage chamber 2a. In order to smooth the movement chip components P (FIGS. 6–9) as later described within the storage chamber 2a, the section of the inclined bottom surface 2d is made to have a concave surface. The storage housing 2 is constituted, having a non-transparent member having the inclined bottom surface 2d and a transparent plate covering a side surface of the non-transparent member, in such a way that both the member and the plate are made to overlap each other and screwed together on a frame 1. The storage chamber 2a is pentagonal in side configuration and composed of a space having a fixed width. The kind, residual amount, etc. of the stored components can be easily confirmed from outside the chamber 2a through the transparent plate.

In the storage chamber 2a, many chip components P of one kind such as a chip resistor, a chip capacitor, or a chip inductor, are stored in a bulk state. Each of the chip components P stored in the storage chamber 2a has a dimensional relation of length>width>thickness or of length>width=thickness. Of course, if having the same configuration as mentioned above, other electronic components than the chip components, such as composite components of, for example, an LC filter or network, integrated circuit components of, for example, a semiconductor element, etc. can also be handled as objects to be supplied.

The bush 3 has an outside diameter conforming to the inside diameter of the through hole 2c and an inner hole having a prescribed insided-diameter. The bush 3 is mounted by being forcedly inserted into the through hole 2c. The bush 3 has a conical inclined surface at its upper end and, in a state where the bush 3 is mounted, the upper end of the inclined surface coincides with an upper end of the through hole 2c. Although the bush 3 is provided for the purpose of smoothly moving the first taking-in member 4 as later described up and down, in a case where the inner surface of the through hole 2c can be made to have a moderate degree of slippage, the bush 3 is not always required to be provided.

As illustrated in FIGS. 2(A) to 2(C), the first taking-in member 4 has a part having semi-circular cross section at its upper portion and has a longitudinal flat surface 4a having a prescribed width W11 at its one side. The flat surface 4a has a recessed portion 4b at its upper portion. A depth T1 of the recessed portion 4b is slightly larger than ½ of the thickness of the chip component P, concretely, a depth T1 is 1.2 times as large as ½ of the thickness of the chip component P. Also, the flat surface 4a has a straight groove 4c at its center. The depth of the groove 4c is the same as the depth T1 of the recessed portion 4b and a width W12 is slightly larger than the width of the chip component P, concretely, a width W12 is 1.2 times as large as the width of the chip component P.

Also, at a boundary portion between the recessed portion 4b and the groove 4c, there is formed a leading surface 4d for inducing the chip component P from the recessed portion 4b toward the groove 4c. Specifically, the illustrated leading surface 4d consists of two straight inclined surfaces taking the form of "V", the upper ends of which are located at the positions lower by a length L1 than the upper end of the recessed portion 4b, with the result that the configuration in FIG. 2(B) of the recessed portion 4b is pentagonal. Also, an angle θ1 of the letter "V" of the leading surface 4d is 90 degrees, and the angle of inclination of each of the two inclined surfaces is 45 degrees with respect to the center line in the widthwise direction of the flat surface 4a. It is to be noted that the angle θ1 of the letter "V" of the leading surface 4d is not limited to 90 degrees and, if falling within a range of from 45 to 120 degrees, any angle thereof may serve the purpose. Also, the leading surface 4d may be constituted by a concave or convex surface other than the straight inclined surface.

Further, the first taking-in member 4 has formed in its upper end a guiding surface 4e for guiding the stored components P toward the recessed portion 4b. Specifically, the illustrated guiding surface 4e consists of an inclined surface and forms a V letter shape with a similar guiding surface 5e formed in the second taking-in member 5. The inclination angle α1 of the guiding surface 4e is 45 degrees with respect to the flat surface 4a. When the upper end of the first taking-in member 4 and the upper end of the second taking-in member 5 are at the same height, the angle of the V letter shape formed by the both guiding surfaces 4e and 5e (FIG. 3) is 90 degrees. It is to be noted that the angle of the letter "V" as defined by the both guiding surfaces 4e and 5e is not limited to 90 degrees and, if falling within a range of from 45 to 120 degrees, any angle thereof may serve the purpose. Also, each of the guiding surfaces 4e and 5e can be constituted by a concave or convex surface other than the straight inclined surface.

Furthermore, on a side opposite to the side where the flat surface 4a of the first taking-in member 4 is located, a stopper pin 4f for making minute adjustment of the amount of movement of the first taking-in member 4 is mounted by insertion and fastened by screwing. Also, between the enlarged portion at a lower end of the stopper pin 4f and the bottom surface of the first taking-in member 4 there is interposed a coil spring 4g.

As illustrated in FIGS. 3(A) to 3(C), the second taking-in member 5 has a part having semi-circular cross section in the same as the part of the first taking-in member 4 at its upper portion and has a longitudinal flat surface 5a having a prescribed width W21 at its one side. As in the case of the first taking-in member 4, the flat surface 5a has a recessed portion 5b at its upper portion. A depth T2 of the recessed portion 5b is slightly larger than ½ of the thickness of the chip component P, concretely, a depth T2 is 1.2 times as large as ½ of the thickness of the chip component P. Also, the flat surface 5a has a straight groove 5c at its center. A depth of the groove 5c is the same as the depth T2 of the recessed portion 5b and a width W22 is slightly larger than the width of the chip component P, concretely, a width W22 is 1.2 times as large as the width of the chip component P.

Also, at a boundary portion between the recessed portion 5b and the groove 5c, there is formed a leading surface 5d for inducing the chip components P from the recessed portion 5b toward the groove 5c. Specifically, the illustrated leading surface 5d consists of two straight inclined surfaces taking the form of a letter "V", the upper ends of which are located at the positions lower by a length L2 than the upper end of the recessed portion 5b, with the result that the configuration in FIG. 3(B) of the recessed portion 5b is pentagonal. The length L2 is the same as the length L1 of the first taking-in member 4. Also, an angle θ2 of the letter "V" of the leading surface 5d is 90 degrees, and the angle of inclination of each of the two inclined surfaces is 45 degrees with respect to the center line in the widthwise direction of the flat surface 5a. It is to be noted that the angle θ2 of the letter "V" of the leading surface 5d is not limited to 90 degrees and, if falling within a range of from 45 to 120 degrees, any angle thereof may serve the purpose. Also, the leading surface 5d may be constituted by a concave or convex surface other than the straight inclined surface.

Further, the second taking-in member 5 has formed in its upper end a guiding surface 5e for guiding the stored components P toward the recessed portion 5b. Specifically, the illustrated guiding surface 5e consists of an inclined surface and the angle of inclination α2 thereof is 45 degrees with respect to the flat surface 5a. The relation between the guiding surface 5e and the guiding surface 4e of the first taking-in member 4 is as stated previously.

Furthermore, the second taking-in member 5 has formed therein a discharge passageway 5f whose inlet is communicated with a lower end of the groove 5c and which is rectangular in cross section. The width of the discharge passageway 5f is the same as that of the groove 5c and the depth thereof is twice as large as the depth of the groove 5c. More specifically, the illustrated discharge passageway 5f in FIG. 3(A) is composed of a portion extending from the lower end of the groove 5c in the rightward and downward direction, a portion extending from a lower end of this portion right in the downward direction, a portion curving 90 degrees from a lower end of this portion in the leftward direction, and a portion extending from a left end of this portion right in the lateral direction. The portion extending right in the lateral direction has its underside made open, whereby the discharge passageway 5f is contacted at this portion with the surface of the belt 8.

Furthermore, at the center of a portion of the flat surface 5a lower than the inlet of the discharge passageway 5f of it, there is formed a strip-like projection 5g having the same width and height as of the width and depth of the groove 4c of the first taking-in member 4, respectively. The strip-like projection 5g has a function of guiding the movement of the components from the groove 5c to the discharge passageway 5f and a function of regulating the moving direction of the first taking-in member 4 when the same moves with the projection 5g being in engagement with the groove 4c of the first taking-in member 4.

Furthermore, the second taking-in member 5 is constructed in such a way that the side surface of a portion thereof having the discharge passageway 5f formed therein has a transparent plate 5h detachably screwed with respect thereto. The discharge passageway 5f is open at the transparent plate 5h side thereof and this opening is covered by the transparent plate 5h. Therefore, the state of the interior of the discharge passageway 5f can be easily confirmed from outside the same through the transparent plate 5h.

Figure 4:
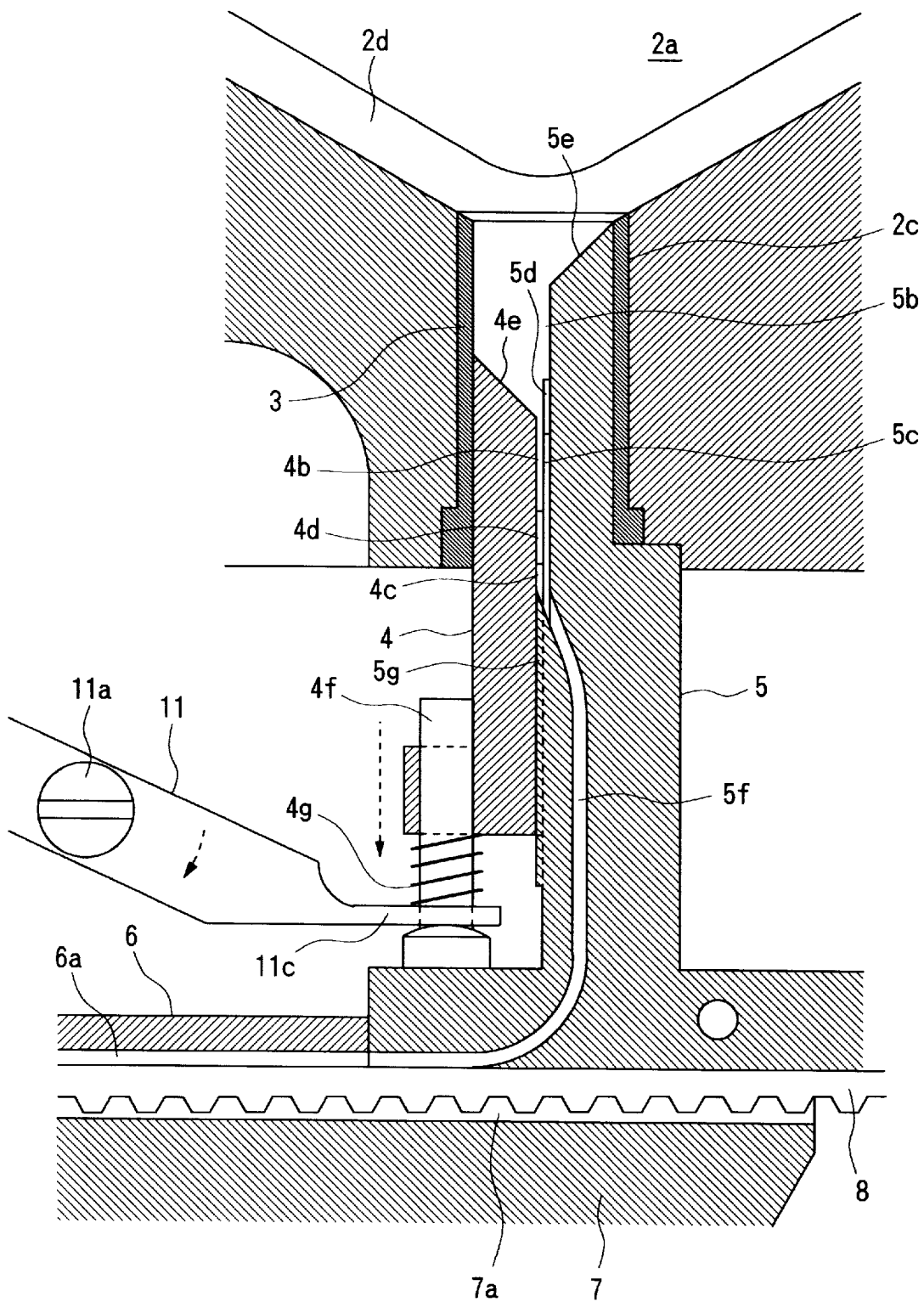
FIG. 4 is an enlarged longitudinal sectional view of a principal part of FIG. 1.

As illustrated in FIG. 4, the first taking-in member 4 and second taking-in member 5 have their upper portions inserted into the bush 3 with their flat surfaces 4a and 5a being kept in surface contact with each other by the strip-like projection 5g being fitted into the groove 4c. Namely, with their flat surfaces 4a and 5a being in surface contact with each other, the respective upper portions of the first taking-in member 4 and second taking-in member 5 come to have a column configuration whose outside diameter is substantially in coincidence with the inner hole diameter of the bush 3. The second taking-in member 5 is inserted up to a position at which the upper end thereof coincides with the upper end of the inside hole of the bush 3, and is screwed to the frame 1. On the other hand, the first taking-in member 4 can be moved up and down within the bush 3 in parallel with the second taking-in member 5 in a state where the flat surface 4a is in surface contact with the flat surface 5a of the second taking-in member 5 and where the strip-like projection 5g of the second taking-in member 5 is fitted in the groove 4c.

The component guide 6 has in its underside a straight line guide 6a having the same width and depth as those of the right laterally extending portion of the discharge passageway 5f. The component guide 6 is screwed to the frame 1 so that the straight groove 6a may be communicated with the right laterally extending portion of the discharge passageway 5f with no difference in level therebetween.

The belt guide 7 has in its upper surface a straight line groove 7a having a width and depth the values of which are slightly larger than the values of the width and thickness of the belt 8. The belt guide 7 is screwed to the frame 1 so that the center in the widthwise direction of the straight groove 7a may coincide with the center in the widthwise direction of the straight groove 6a of the components guide 6.

The belt 8 consists of a non-magnetic timing belt or flat belt formed of synthetic rubber, soft resin, or the like. It is wound around pulleys 9 (the front side pulley is not illustrated) that are rotatably supported by the frame 1 at the front and rear positions of the belt guide 7. And the flat portion on the upper side of the belt 8 is located within the straight groove 7a of the belt guide 7, whereby the surface of this flat portion is movably kept in contact with the underside of the component guide 6 and the bottom surface of the second taking-in member 5 by the winding tension. By the front side pulley 9 being intermittently rotated through and in units of a prescribed angle through a drive mechanism such as a ratchet mechanism, the belt 8 is intermittently forwardly moved in units of a prescribed distance to thereby convey the components to a component taking-out position located at the leftward zone in FIG. 4.

The operation lever 10 has its one end rotatably mounted on the frame 1 through a pin 10a and is urged clockwise in FIG. 1 by a coil spring S1 tensioned between itself and the frame 1. The position at which the operation lever 10 is restored is regulated by a positioning stopper 12 provided on the upper side of the operation lever 10. More specifically, the positioning stopper 12 includes a circular disk having an eccentric hole and a fastening screw and, by changing the direction of the circular disk, the restoration position of the operation lever 10 can be minutely adjusted.

The drive lever 11 has its central portion rotatably mounted on a lower side of the operation lever 10 of the frame 1 through a pin 11a, and is urged clockwise in FIG. 1 by a coil spring S2 tensioned between itself and the operation lever 10. The force relation between the coil springs S1 and S2 is S1>S2. Also, a roller 11b abutting on the underside of the operation lever 10 is provided on one end of the drive lever 11. Further, an engaging portion 11c having a U-shaped groove or round hole is formed in the other end of the drive lever 11. The engaging portion 11c is interposed between the enlarged portion at the lower end of the stopper pin 4f of the first taking-in member 4 and the coil spring 4g.

The operation of the first embodiment will hereafter be explained.

Figure 6:
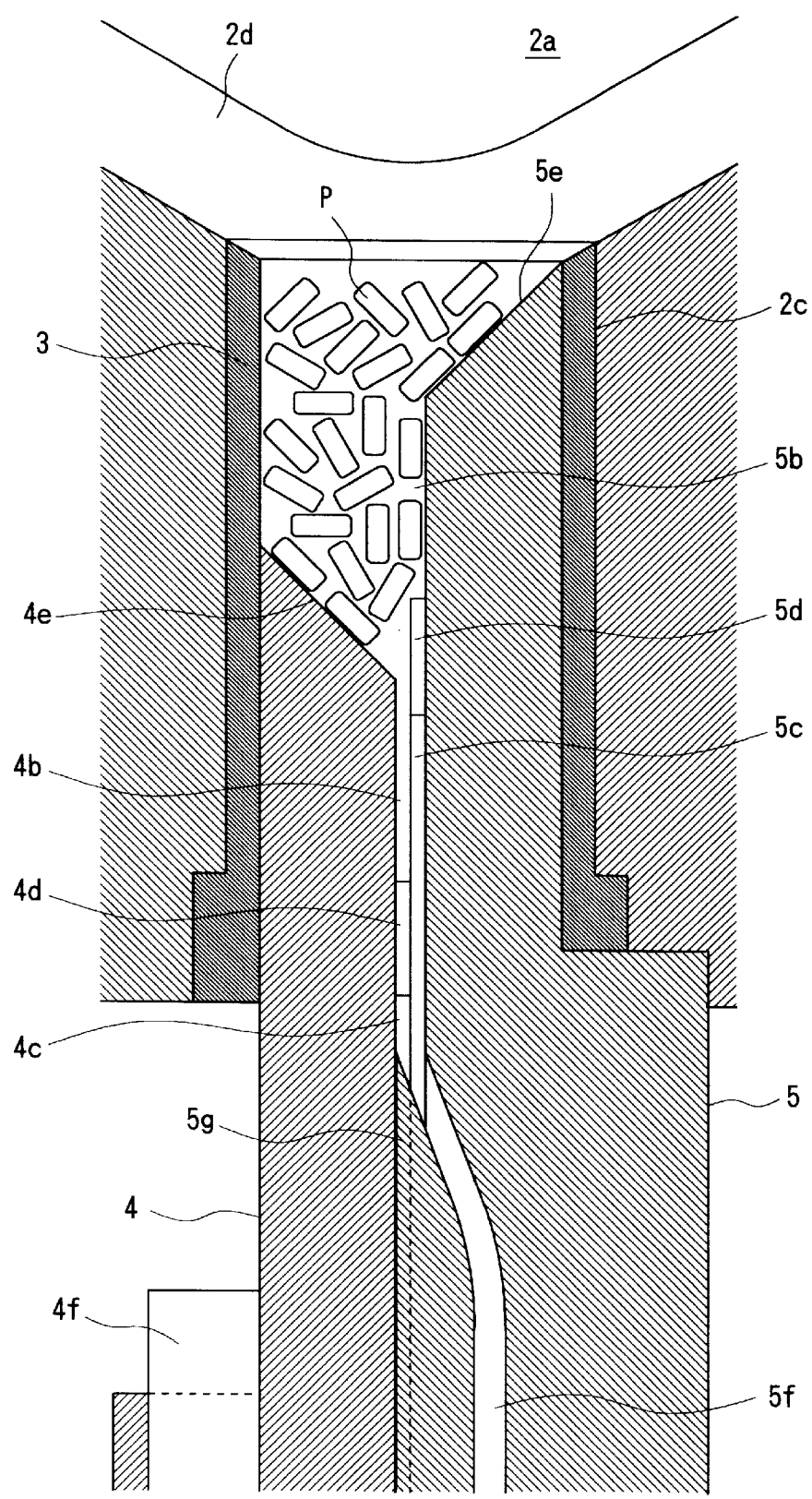
FIG. 6 is a view illustrating a component taking-in operation in the first embodiment.

In the standby state illustrated in FIGS. 1 and 4, the first taking-in member 4 is located at its lowered position, whereby the lower end of the stopper pin 4f abuts the second taking-in member 5. In this state, the upper end of the first taking-in member is located at a position lower than the upper end of the inner hole of the bush 3 and, as illustrated in FIG. 6, several of the stored components P enter a space formed on the upper side of the first taking-in member 4. Although in FIG. 6 description is made, for convenience of explanation, of a somewhat smaller amount of the components P stored in the storage chamber 2a, a larger number of the chip components P than this is actually stored therein.

When downwardly depressing the movable end of the operation lever 10 from this standby state against the urging force of the coil spring S1, the operation lever 10 is rotated counterclockwise in FIG. 1 about the pin 10a. By the operation lever 10 being rotated, the roller 11b of the drive lever 11 is downwardly depressed against the urging force of the coil spring S2, with the result that the drive lever 11 is rotated counterclockwise in FIG. 1 about the pin 11a.

Figure 5:
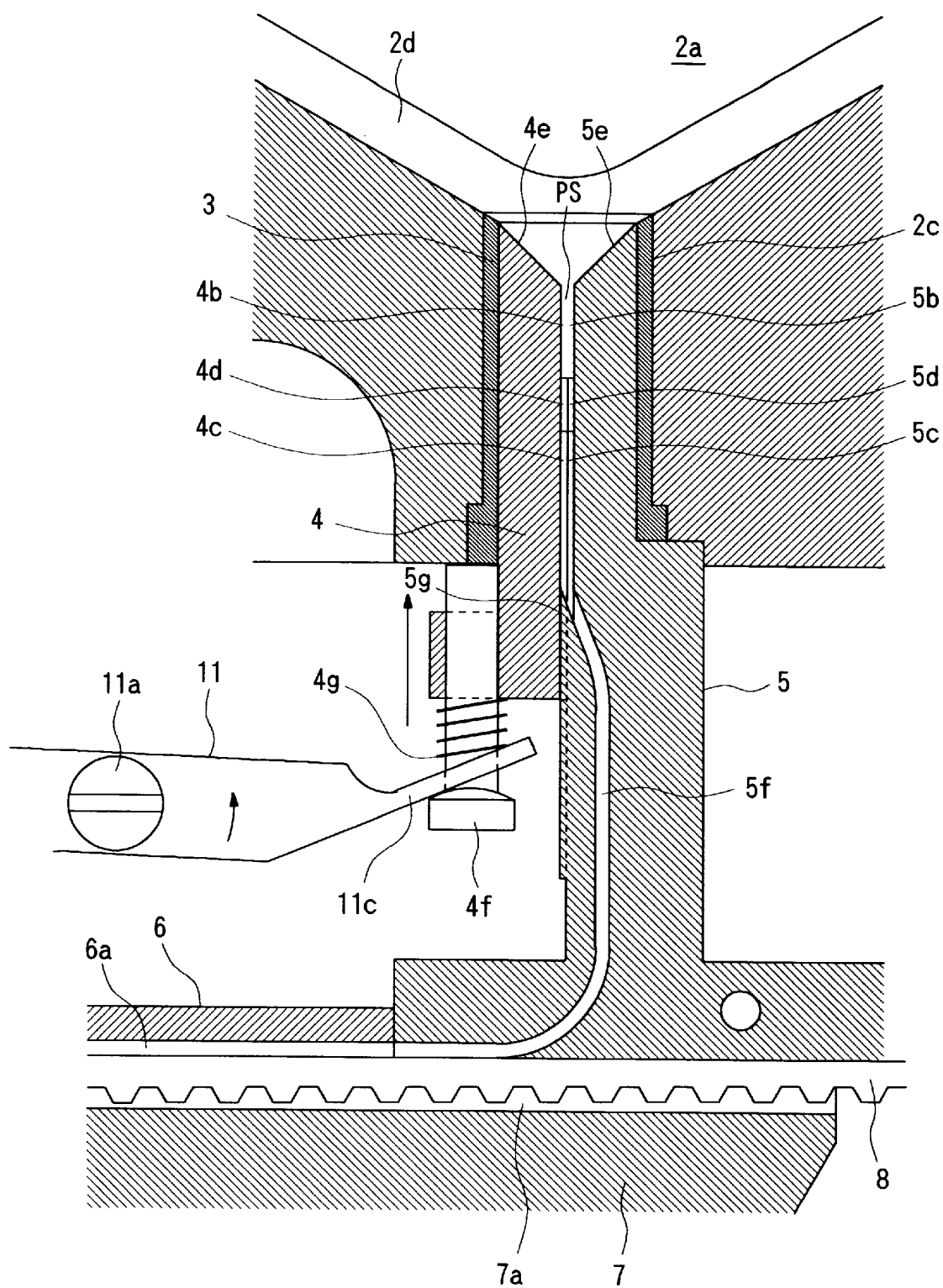
FIG. 5 is a view of operational illustration corresponding to FIG. 4.
Figure 7:
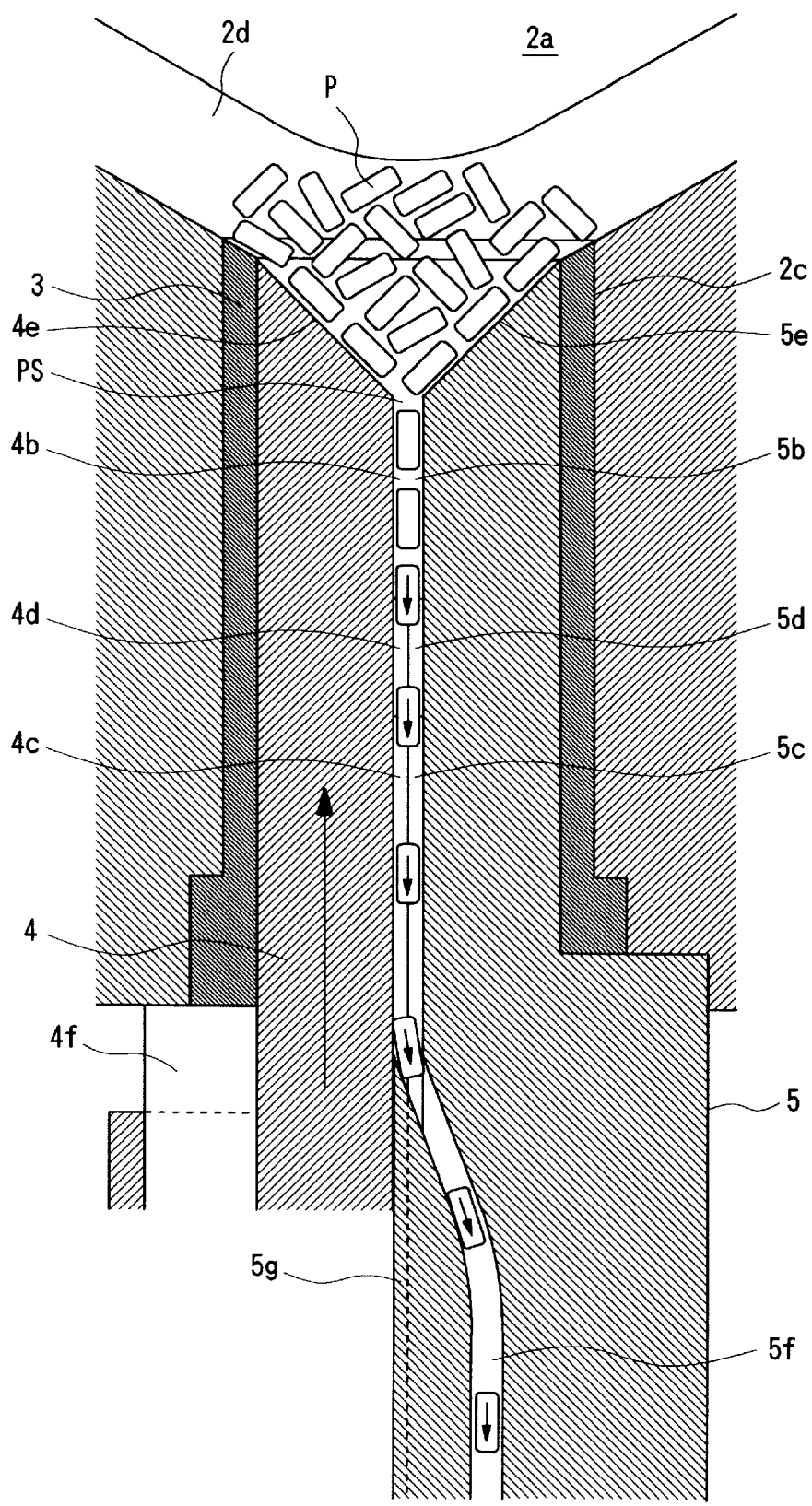
FIG. 7 is a view illustrating the component taking-in operation in the first embodiment.
Figure 8:
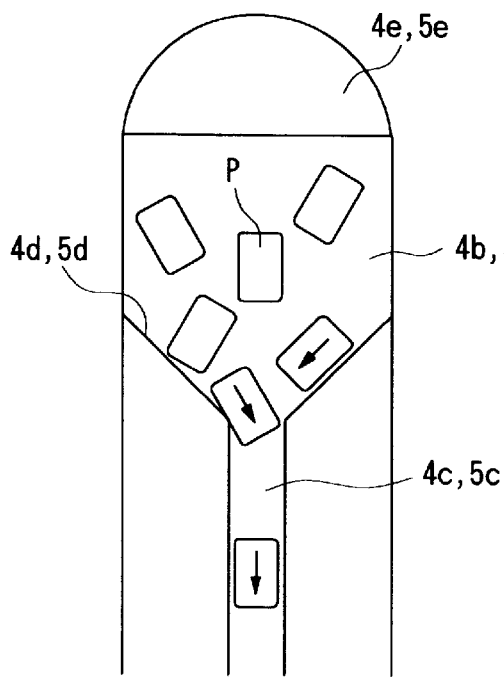
FIGS. 8(A) and 8(B) are views illustrating the components taking-in operation in the first embodiment.
Figure 8:
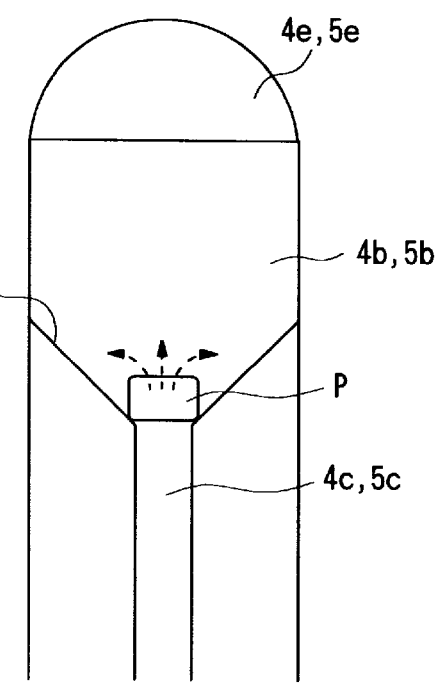

And, as illustrated in FIGS. 5 and 7, by the engaging portion 11c of the drive lever 11, the first taking-in member 4 is raised by a prescribed stroke from its lowered position. Specifically, the taking-in member 4 is raised until the upper end of the guiding surface 4e rises up to the same level as that of the upper end of the guiding surface 5e of the second taking-in member 5. The raised position of the first taking-in member 4 is regulated by the upper end of the stopper pin 4f being abutted on the underside of the storage housing 2.

When releasing the downward depression of the movable end of the operation lever 10, the operation lever 10 and drive lever 11 are restored to the standby state by the urging forces of the springs, causing the first taking-in member 4 to be lowered from its raised position and returned to the standby state.

In the process in which the first taking-in member 4 is raised, as illustrated in FIG. 7, the chip components P that have theretofore entered the upper side space of the first taking-in member 4 are lifted upward, with the result that the stored components P are stirred. When the upper end of the first taking-in member 4 and the upper end of the second taking-in member 5 are at have become the same level, each mated two of the mated recessed portions 4b, 5b, mated leading surfaces 4d, 5d, and mated guiding surfaces 4e, 5e are at the same in level to oppose each other. Also, the both guiding surfaces 4e and 5e take the form of a letter "V" while, on the other hand, a parallel space PS defined by mated parallel surfaces is formed at the upper portions of the two taking-in members 4 and 5 by the mutually opposing recessed portions 4b and 5b. The clearance of the parallel space PS is larger than the thickness of one chip component P and smaller than the total sum of the thicknesses of two chip components P. In other words, the spacing between the parallel walls of mated recessed portions 4b and 5b is a distance that is between the thickness of one chip component P and two of the chip components. Further, the groove 4c of the first taking-in member 4 and the groove 5c of the second taking-in member 5 oppose each other at the same level, whereby there is formed a supply passageway (having no reference symbol annexed thereto) the configuration of which is rectangular in cross section and slightly larger than the configuration of an end surface of the chip component P. The supply passageway plays the role of having the chip components P taken lengthwise thereinto one by one and moving them downward by their own weight.

Namely, as illustrated in FIG. 7, while being guided by the guiding surfaces 4e and 5e defining a letter "V" toward the parallel space PS, the chip components P within the storage chamber 2a enter into the parallel space PS by being oriented in a prescribed direction, concretely in a direction in which the clearance of the parallel space PS and the thickness of the chip components P match with each other.

As illustrated in FIG. 8(A), the chip components P that have entered the parallel space PS are induced toward the supply passageway (the grooves 4c and 5c) along the inclinations of the V letter leading surfaces 4d and 5d and, in a state where the thicknesswise direction and the widthwise direction have coincided respectively, are entered lengthwise into the supply passageway on a one by one basis. Thereafter, the chip components P move downward within the supply passageway by their own weight. It is to be noted that if the boundary portions between the leading surfaces 4d, 5d and the grooves 4c, 5c are respectively rounded or chamfered, the taking of the components into the supply passageway can be more smoothly effected.

As illustrated in FIG. 8(B), there is the likelihood that the chip components P which have entered the parallel space PS will be located laterally at the upper end position of the grooves 4c and 5c and close the supply passageway. However, when the first taking-in member 4 rises or falls, this chip component P is displaced in the directions indicated by broken lines in FIG. 8(B) and can therefore be removed readily from such position.

The rise and fall of the first taking-in member 4 through the use of the operation lever 10 and drive lever 11 are repeatedly caused each time the chip components P having been conveyed up to the components taking-out position by the belt 8 is taken out by an absorbing nozzle. Therefore, the chip components P within the storage chamber 2a repeatedly undergo the above-mentioned taking-in action.

Figure 9:
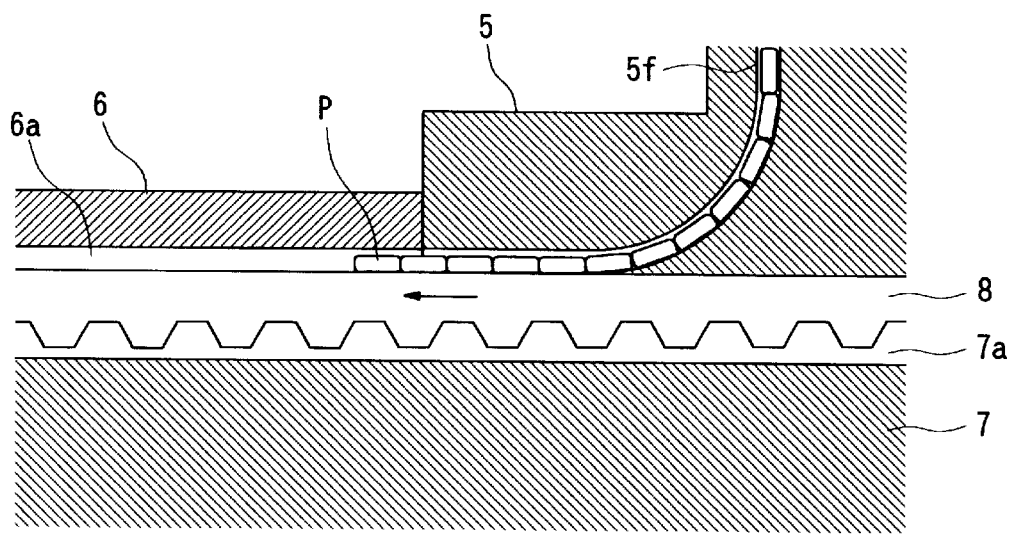
FIG. 9 is a view illustrating a discharging movement of components onto a belt and the conveying movement thereof by the belt in the first embodiment.

As illustrated in FIG. 7, the chip component P that has been taken into the supply passageway and moved downward by its own weight is transferred, in a state where the thicknesswise direction and the widthwise direction are in coincidence with each other, to the interior of the discharge passageway 5f of the second taking-in member 5 through the upper end of the strip-like projection 5g located on the lower side thereof. The chip components P that have been transferred to the interior of the discharge passageway 5f are moved further downwardly by its own weight in the discharge passageway 5f along the configuration thereof while being kept in said state. Then, as illustrated in FIG. 9, after having its posture changed approximately 90 degrees from the lengthwise orientation to the lateral orientation, the chip component P is discharged from a terminating end of the discharge passageway 5f onto the surface of the belt 8.

The belt 8 is forwardly and intermittently moved in units of a prescribed distance, preferably a distance longer than the length of the chip component P, in conformity with the rise/fall operation of the first taking-in member 4. Therefore, the chip component P that has been discharged from the discharge passageway 5f is forwardly moved jointly with the belt 8 in units of the same distance as mentioned above and is thereby conveyed up to the components taking-out position. Since the intermittent movement of the belt 8 is repeatedly made each time the chip component P is taken out, the chip components P arranged in succession within the discharge passageway 5f are discharged sequentially onto the surface of the belt 8 in a state of their being kept in the same posture and, while being drawn up in line by the straight groove 6a of the component guide 6, these chip components P are conveyed toward the component taking-out position in a state of their being arrayed in a row.

In this way, according to the first embodiment, the movable side first taking-in member 4 of the two taking-in members 4 and 5 whose flat surfaces 4a and 5a are kept in surface contact with each other is moved up and down, whereby the prism-shaped chip components P stored in the storage chamber 2a in a bulk state can be caused to enter into the parallel space PS between the upper portions of the two taking-in members 4 and 5 in a state where the thicknesswise directions thereof are equally oriented. And, the chip components P that have been entered into the parallel space PS can be taken lengthwise into the supply passageway (the grooves 4c, 5c) on a one by one basis in a state where the thicknesswise direction and the widthwise direction are made the same, whereby the components P can be moved downward by their own weight and, while they are being kept in said state, can be moved further downward by the discharge passageway 5f by their own weight.

Since the chip components P stored in the storage chamber 2a can enter the parallel space PS between the upper portions of the two taking-in members 4 and 5 in a state where the thicknesswise directions thereof are equally oriented and the chip components P that have entered the parallel space PS are taken lengthwise into the supply passageway (the grooves 4c, 5c) one by one in a state where the thicknesswise direction and the widthwise direction are made the same, the probability that the prism-shaped chip components P will be taken with a prescribed posture into the supply passageway can be remarkably enhanced. As a result, the operation of supplying the prism-shaped chip components P stored within the storage chamber 2a in the state of their being oriented and arrayed in a prescribed direction can be performed stably and successively.

Figure 10:
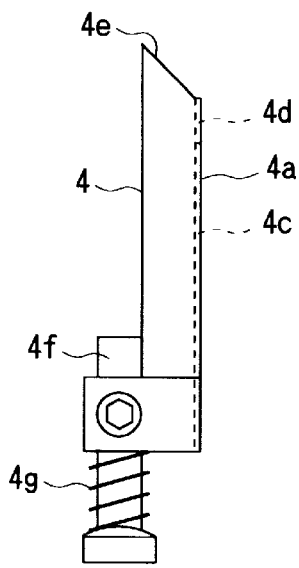
FIG. 10(A) is a side view illustrating a modification of the first taking-in member and FIG. 10(B) is a front view thereof.
Figure 10:
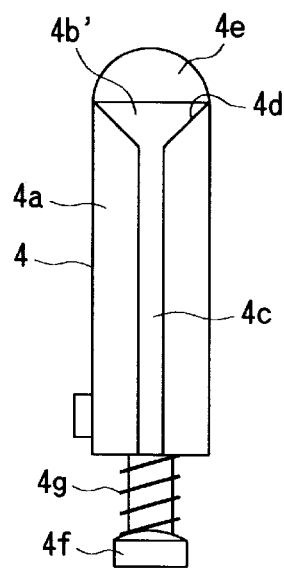
Figure 11:
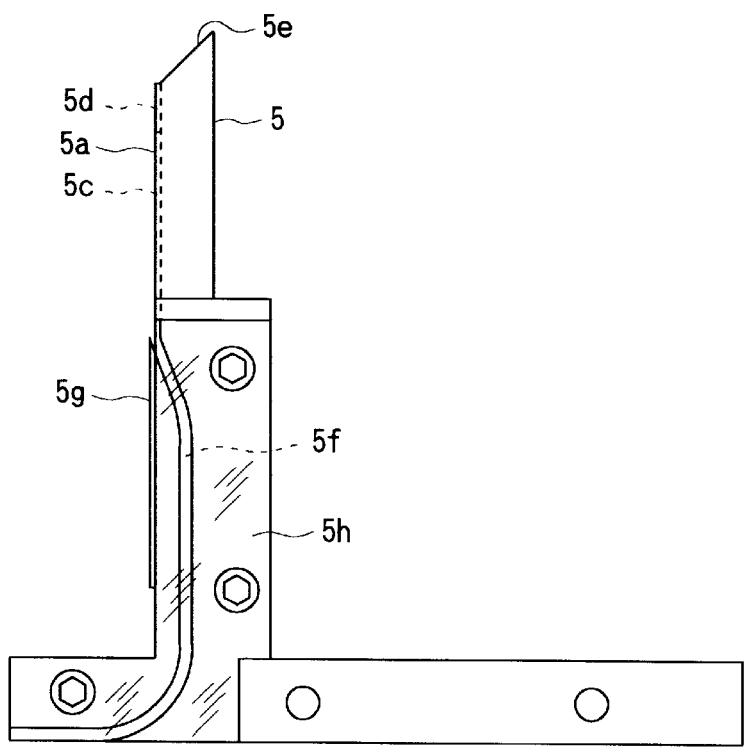
FIG. 11(A) is a side view illustrating a modification of the second taking-in member, corresponding to the first taking-in member illustrated in FIGS. 10(A) and 10(B)
FIG. 11(B) is a front view thereof.
Figure 11:
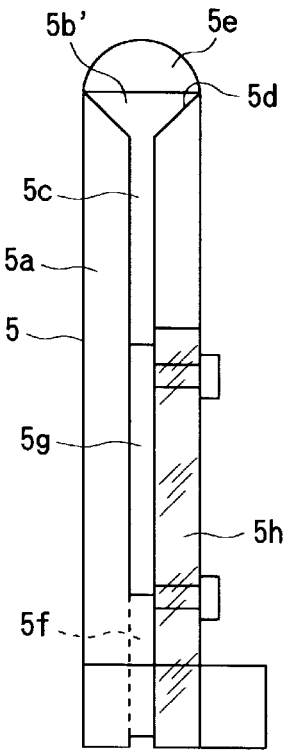

Incidentally, although in the first embodiment an arrangement has been illustrated wherein the upper ends of the leading surfaces 4d, 5d are made lower in position than the upper ends of the recessed portions 4b, 5b to thereby make each of the recessed portions 4b, 5b pentagonal in shape, it may be arranged that as illustrated in FIGS. 10(A) and 10(B)

the upper end of the leading surface 4d of the first taking-in member 4 is made the same in level as the upper end of the recessed portion 4b and as illustrated in FIGS. 11(A) and 11(B) the upper end of the leading surface 5d of the second taking-in member 5 is made the same in level as the upper end of the recessed portion 5b to thereby make each of the recessed portions 4b ', 5b ' take the form of an inverse triangle. In this case, although the area of the parallel space PS formed by the recessed portions 4b', 5b', becomes smaller, it is possible to realize the same component taking-in operation as mentioned above.

Also, although in the first embodiment an arrangement has been illustrated wherein the width of the recessed portion 4b and that of the flat surface 4a are made the same and the width of the recessed portion 5b and that of the flat surface 5a are made the same, the width of each of the recessed portions 4b, 5b may be smaller than that of each of the flat surfaces 4a, 5a. In this case, also, although the area of the parallel space PS formed by the recessed portions 4b, 5b becomes smaller, it is possible to realize the same components taking-in operation as mentioned above.

Figure 12:
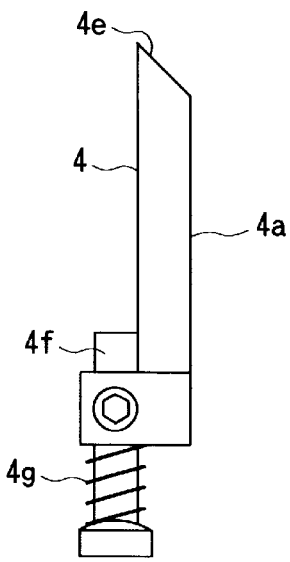
FIG. 12(A) is a side view illustrating another modification of the first taking-in member and FIG. 12(B) is a front view thereof.
Figure 12:
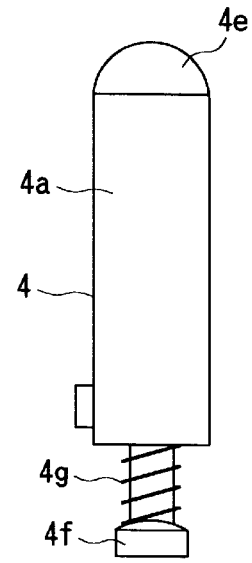
Figure 13:
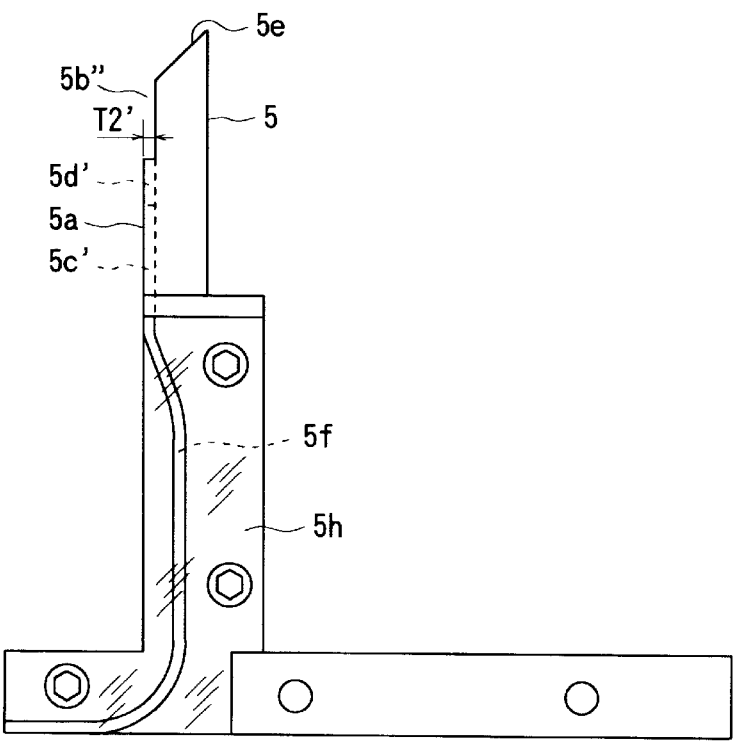
FIG. 13(A) is a side view illustrating another modification of the second taking-in member, corresponding to the first taking-in member illustrated in FIGS. 12(A) and 12(B)
FIG. 13(B) is a front view thereof.
Figure 13:
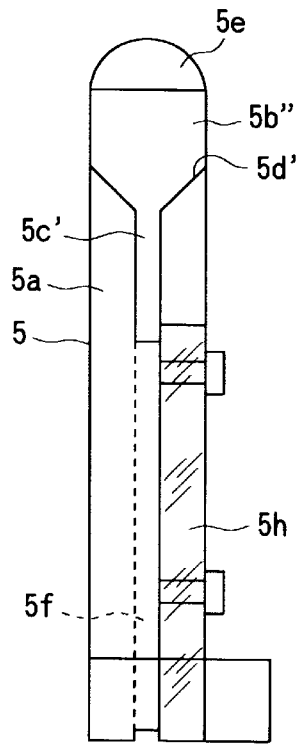

Further, although in the first embodiment an arrangement has been illustrated wherein the recessed portions 4b, 5b, grooves 4c, 5c and leading surfaces 4d, 5d are provided respectively in both the first taking-in member 4 and the second taking-in member 5, it may be arranged that as illustrated in FIGS. 12(A) and 12(B) the recessed portion 4b, groove 4c and leading surface 4d are abated from the flat surface 4a of the first taking-in member 4 and, on the other hand, as illustrated in FIGS. 13(A) and 13(B), a recessed portion 5b' having a depth T2' twice as large as the depth T2 and a groove 5c' and leading surface 5d' corresponding thereto are provided in the second taking-in member 5. In this case, since the supply passageway is constructed by only the groove 5c' alone, it is not necessary to provide a strip-like projection 5g such as that in the first embodiment on the side of the second taking-in member 5. With even this arrangement, it is possible to realize the same components taking-in operation as mentioned above. of course, conversely to the arrangement as mentioned above, it may be arranged that the recessed portion 5b, groove 5c and leading surface 5d are abated from the flat surface 5a of the second taking-in member 5 a recessed portion, groove and leading surface similar to those mentioned above are formed in the first taking-in member 4.

Further, although in the first embodiment the first taking-in member 4 and the second -taking-in member 5 have been used, respectively, as the movable side and the stationary side, even when the both taking-in members 4 and 5 are arranged to be alternately moved up and down by the use of a link mechanism or the like, it is possible to realize the same component taking-in operation as mentioned above.

Figure 14:
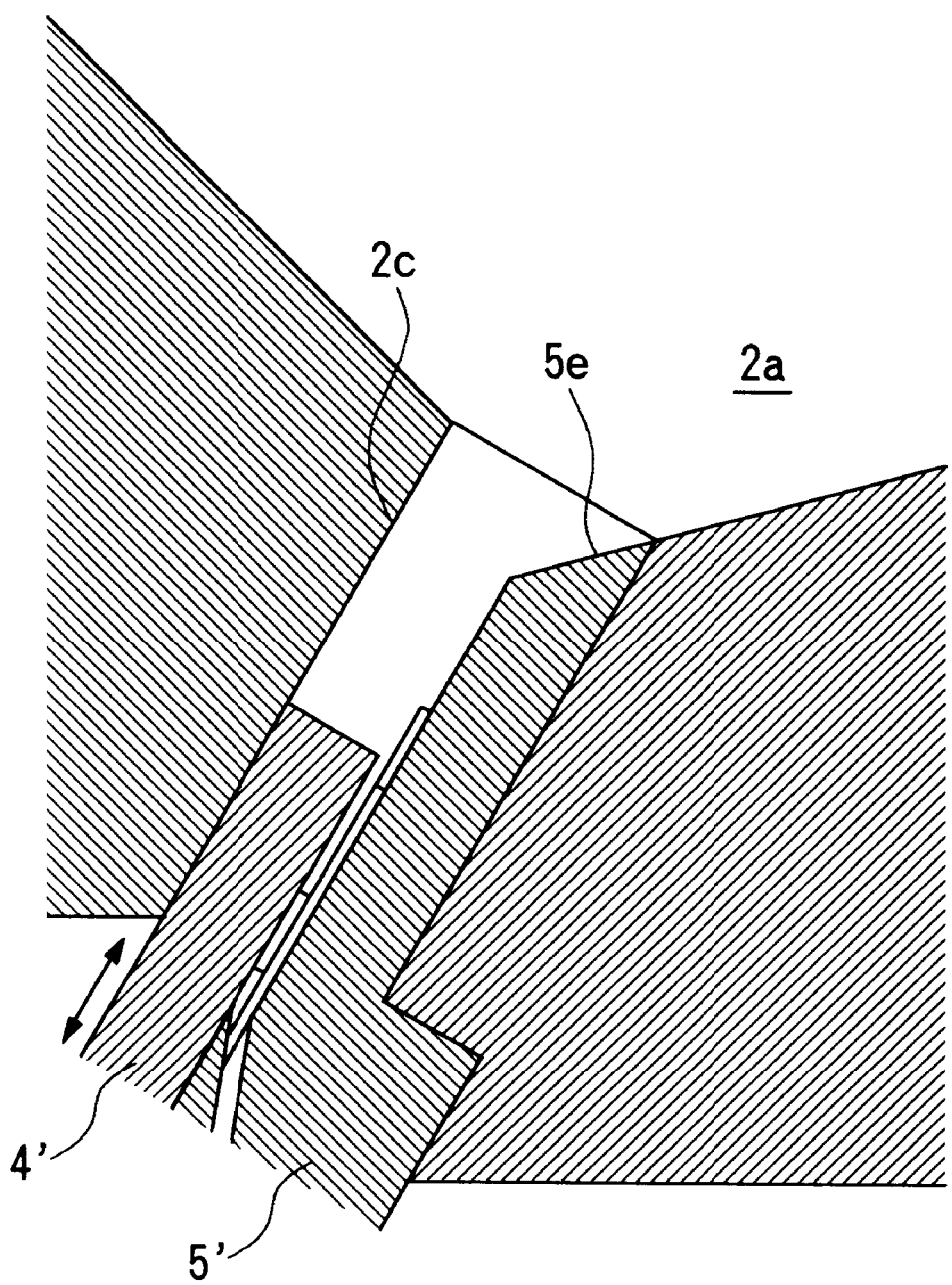
FIG. 14 is a longitudinal sectional view illustrating a principal part of an example of the change in disposition of the first and second taking-in members.

Furthermore, although in the first embodiment an arrangement has been illustrated wherein the first taking-in member 4 and the second taking-in member 5 are both disposed vertically so that the moving direction of the first taking-in member 4 may be vertical, it may be arranged that as illustrated in FIG. 14 a first taking-in member 4' and a second taking-in member 5' are disposed on the lower side of the storage chamber 2a so that both of them may be inclined with respect to the vertical line to thereby make the moving direction of the first taking-in member 4' define an acute angle with respect to the vertical line. In this case, even if no inclined guiding surface is provided in the taking-in member 4' located on the upper side or each of the both taking-in members, it is possible to realize the same components taking-in operation as mentioned above.

FIGS. 15 to 20 illustrate a second embodiment of the present invention. The respect in which the second embodiment differs from the first embodiment is that the recessed portions for forming the parallel space are abated, i.e. reduced in size from the both taking-in members and a movable spacer 23 is used instead. Note that in the following explanation the same reference symbols are used for the parts which are the same in construction as those in the first embodiment and explanations thereof are omitted.

As illustrated in FIGS. 16(A) to 16(C), the first taking-in member 21 has at its upper part a portion substantially semi-circular in cross section and has at its one side a flat surface 21a having a fixed width W31 and long in its longitudinal direction. Also, the first taking-in member 21 has formed in its upper end a guiding surface 21b for guiding the stored components toward the flat surface 21a. More specifically, the illustrated guiding surface 21b consists of an inclined surface and forms a V letter shape together with a similar guiding surface 22b formed in a second taking-in member 22. The angle of inclination α3 of the guiding surface 21b defines an angle of 45 degrees with respect to the flat surface 21a. When the upper end of the first taking-in member 21 and that of the second taking-in member 22 are at the same level, the angle of the V letter shape formed by the both guiding surfaces 21b and 22b is 90 degrees. It is to be noted that the angle of the letter "V" as defined by the both guiding surfaces 21b and 22b is not limited to 90 degrees and, if falling within a range of from 45 to 120 degrees, any angle thereof may serve the purpose. Also, the guiding surfaces 21b, 22b may each be constituted by a concave or convex surface other than the straight inclined surface. Further, at the center of a lower portion of the flat surface 21a there is formed an inclined projection 21c which has a height T3 and width W32 slightly larger than the thickness and width of the chip components P, concretely a height T1 1.2 times as large as the thickness of the chip component P and a width W32 1.2 times as large as the thickness of the chip components P.

As illustrated in FIGS. 17(A) to 17(C), the second taking-in member 22 has at its upper part a portion semi-circular in cross section as in the case of the first taking-in member 21, and has at its one side a flat surface 22a that has a fixed width W4 and that is long in its longitudinal direction. The width W4 of the flat surface 22a is the same as the width W31 of the flat surface 21a of the first taking-in member 21. Also, the second taking-in member 22 has formed in its upper end a guiding surface 22b for guiding the stored components P toward the flat surface 22a. Specifically, the illustrated guiding surface 22b consists of an inclined surface and the angle of inclination α4 thereof is 45 degrees with respect to the flat surface 22a. The relation between the guiding surface 22b and the guiding surface 21a of the first taking-in member 21 is as stated previously. Further, the second taking-in member 22 has formed therein a discharge passageway 22c whose inlet is open to a substantially central position of the flat surface 22a and which is rectangular in cross section. The width of the discharge passageway 22c is slightly larger than the width of the chip component P and the depth thereof is slightly larger than the thickness of the chip component P. Specifically, the width of the discharge passageway 22c is 1.2 times as large as the width of the chip component P and the depth thereof is 1.2 times as large as the thickness of the chip component P. More specifically, the illustrated discharge passageway 22c is composed, as in FIG. 17(A), of a portion extending from the inlet in the rightward and downward direction, a portion extending from a lower end of this portion right in the downward direction, a portion curving 90 degrees from a lower end of this portion in the leftward direction, and a portion extending from a left end of this portion right in the lateral direction. The portion extending right in the lateral direction has its underside made open, whereby the discharge passageway is contacted at this portion with the surface of the belt 8. Further, the second taking-in member 22 is constructed in such a way that the side surface of a portion thereof having the discharge passageway 22c formed therein has a transparent plate 22d detachably screwed with respect thereto. The discharge passageway 22c is open at the transparent plate 22d side thereof and this opening is covered by the transparent plate 22d. Therefore, the state of the interior of the discharge passageway 22c can be easily confirmed from outside the same through the transparent plate 22d.

As illustrated in FIGS. 18(A) and 18(C), the spacer 23 has a thickness T4 slightly larger than the thickness of the chip component P, concretely a thickness T4 1.2 times as large as the thickness of the chip components P, and a width W51 the same as the width W31, W4 of the first taking-in member 21 and second taking-in member 22, and the spacer 23 as a whole is shaped like a letter "L". Also, at the widthwise center of the spacer 23, there is formed downward from the upper end a slit 23a that is long in the lengthwise direction and that has a width W52 slightly larger than the width of the chip component P, concretely a width W52 1.2 times as large as the width of the chip components. Further, the slit 23a has formed at its upper end a leading surface 23b for inducing the chip component P toward the slit 23a. Specifically, the illustrated leading surface 23b consists of two inclined surfaces taking the form of a letter "V". The angle θ3 of the letter "V" of the leading surface 23b is 90 degrees, and the angle of inclination of each of the two inclined surfaces is 45 degrees with respect to the center line in the widthwise direction of the flat surface 23a. It is to be noted that the angle θ3 of the letter "V" of the leading surface 23b is not limited to 90 degrees and, if falling within a range of from 45 to 120 degrees, any angle thereof may serve the purpose. Also, the leading surface 23b may be constituted by a concave or convex surface other than the straight inclined surface. Further, on one side of the spacer 23, a stopper pin 23c for making minute adjustment of the amount of movement of the spacer 23 is mounted by insertion and fastened by screwing. Also, between the enlarged portion at a lower end of the stopper pin 23c and the bottom surface of the spacer 23 there is interposed a coil spring 23d.

Figure 15:
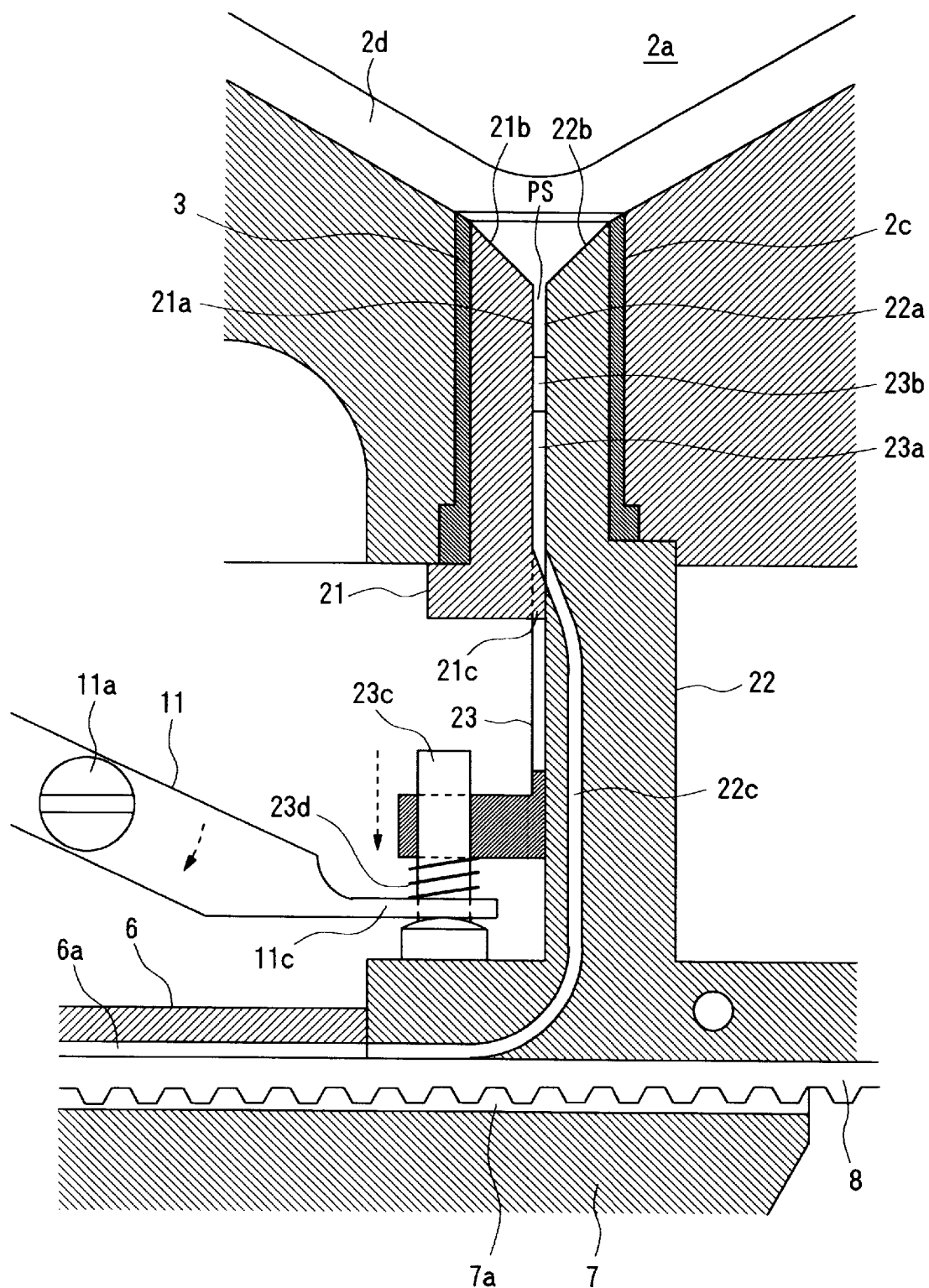
FIG. 15 is a longitudinal sectional view illustrating a principal part of an electronic component supply apparatus according to a second embodiment of the present invention.
Figure 16:
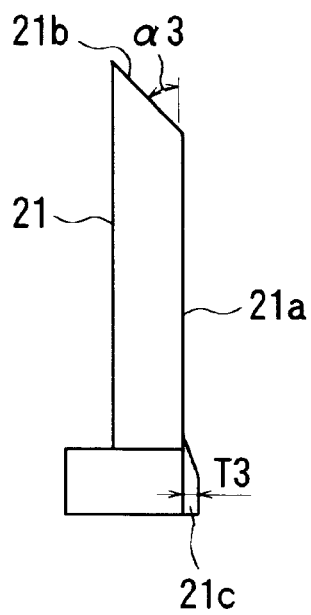
FIG. 16(A) is a side view of a first taking-in member illustrated in FIG. 15.
FIG. 16(B) is a front view thereof.
FIG. 16(C) is a top view thereof.
Figure 16:
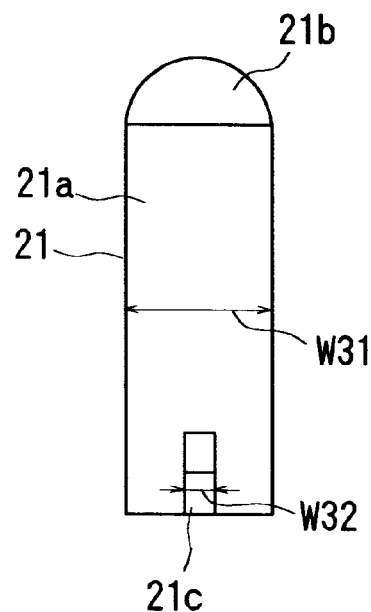
Figure 16:
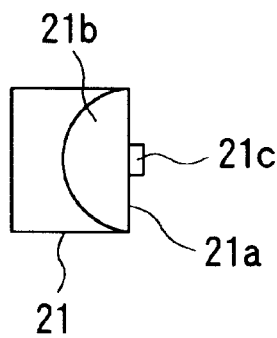
Figure 17:
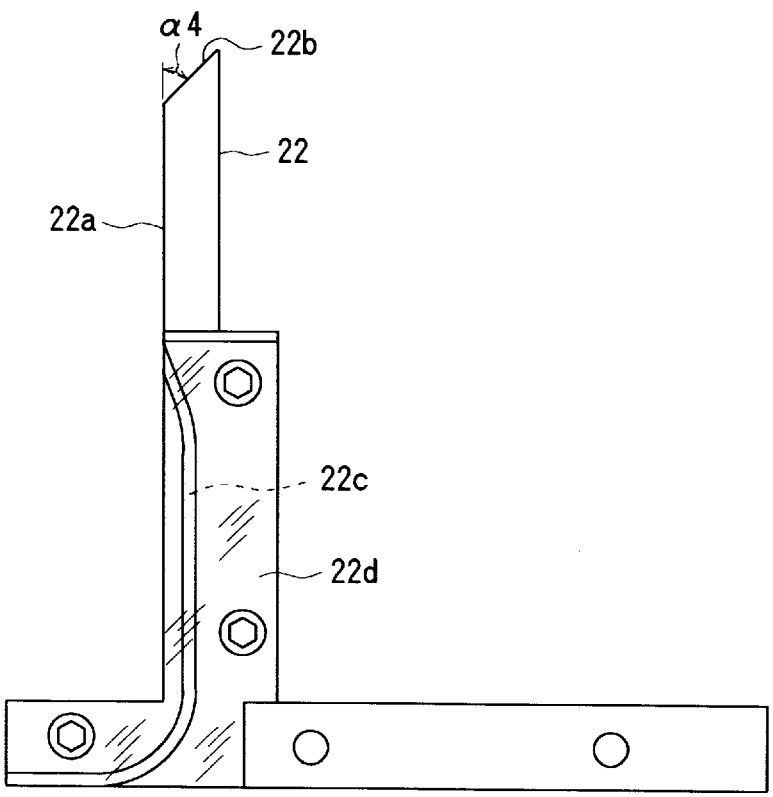
FIG. 17(A) is a side view of a second taking-in member illustrated in FIG. 15.
FIG. 17(B) is a front view thereof.
FIG. 17(C) is a top view thereof.
Figure 17:
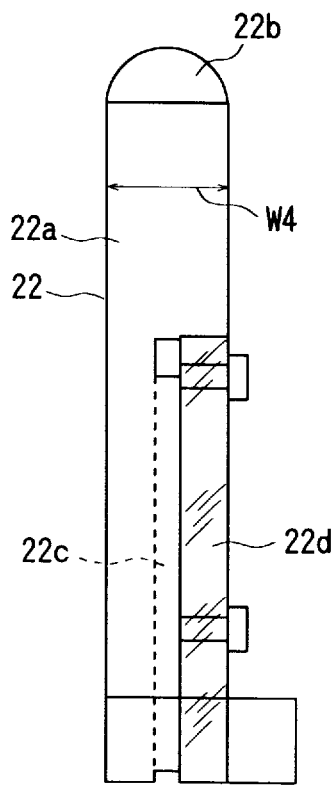
Figure 17:
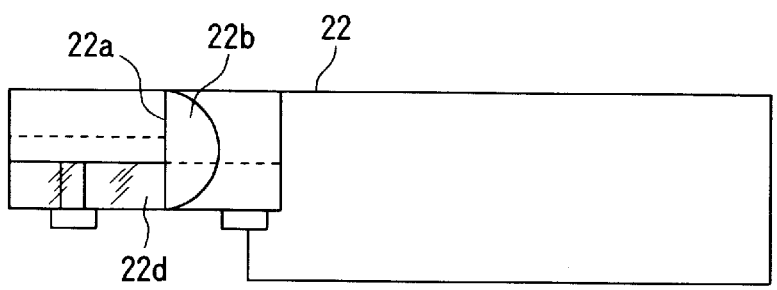
Figure 18:
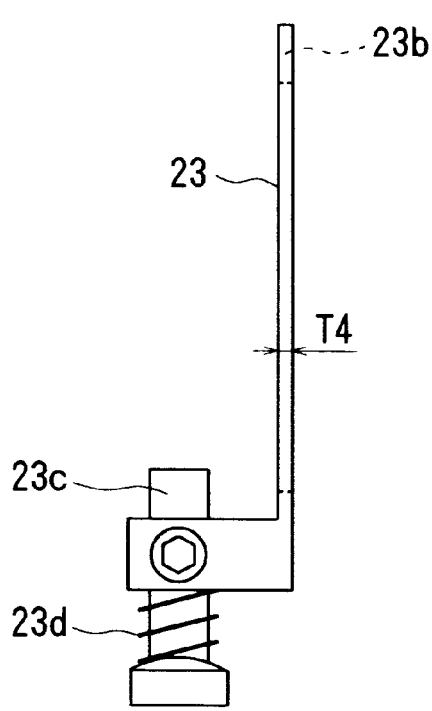
FIG. 18(A) is a side view of a spacer illustrated in FIG. 15.
FIG. 18(B) is a front view thereof.
FIG. 18(C) is an upper surface view thereof.
Figure 18:
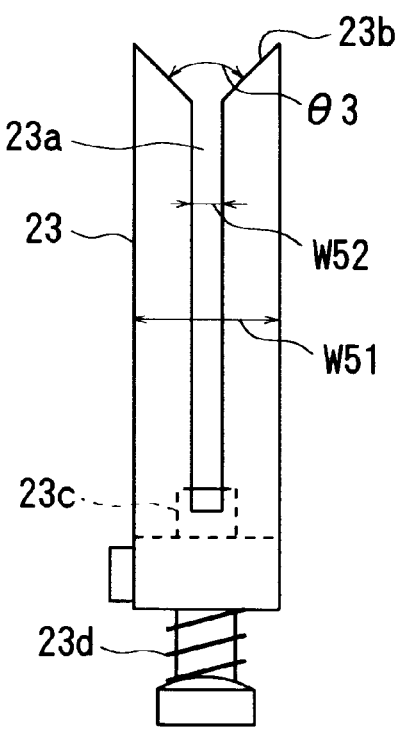
Figure 18:
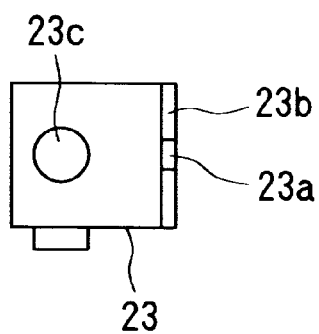

As illustrated in FIG. 15, the first taking-in member 21, second taking-in member 22 and spacer 23 have their upper portions inserted into the bush 3 in a state where the spacer 23 is sandwiched between the flat surface 21a of the first taking-in member 21 and the flat surface 22a of the second taking-in member 22. Namely, in a state where the spacer 23 is sandwiched between the flat surfaces 21a and 22a of the taking-in members 21 and 22, the upper portions of the first taking-in member 21 and second taking-in member 22 take the form of a column configuration whose diameter is substantially in coincidence with the inner hole diameter of the bush 3. The first taking-in member 21 and second taking-in member 22 are inserted up to the position at which the upper ends thereof coincide with the upper end of the inner hole of the bush 3, and are screwed to the frame 1 or storage housing 2. On the other hand, in a state where the spacer 23 is inserted, the spacer 23 has its one side flat surface brought into surface contact with the flat surface 21a of the first taking-in member 21 and has its other side flat surface brought into surface contact with the flat surface 22a of the second taking-in member 22. In addition, in a state where the inclined projection 21c of the first taking-in member 21 is inserted in the slit 23a, the spacer 23 can be moved up and down within the bush 3 in parallel with the first and second taking-in members 21, 22.

The operation of the second embodiment will hereafter be explained.

In the standby state illustrated in FIG. 15, the spacer 23 is located at its lowered position, whereby the lower end of the stopper pin 23c abuts on upper hosizontal surface of the second taking-in member 22. In this state, the upper end of the spacer 23 is located at the position lower than the lower ends of the guiding surfaces 21b, 22b of the first and second taking-in members 21, 22. Also, when the upper end of the first taking-in member 4 and the upper end of the second taking-in member 5 are the same in level, the mated guiding surfaces 21b, 22b are at the same level to oppose each other. Also, guiding surfaces 21b and 22b take the form of a letter "V" and several of the stored components thereby enter into the V-shaped space while, on the other hand, a parallel space PS is formed between the upper portions of the mutually opposing flat surfaces 21a and 22a. The clearance of the parallel space PS is larger than the thickness of one chip component P and smaller than the total sum of the thicknesses of two chip components P. A supply passageway (having no reference symbol annexed thereto) is formed by the slit 23a of the spacer 23 being covered by the flat surfaces 21a, 22a of the first and second taking-in members 21, 22. The configuration of the passageway is rectangular in cross section and conforms to the configuration of an end surface of the chip components P. The chip components P are taken lengthwise into the supply passageway on a one by one basis and move the chip components downward by their own weight.

When downwardly depressing the movable end of the operation lever 10 similar to that in the first embodiment from this standby state against the urging force of the coil spring S1, the operation lever 10 is rotated counterclockwise in FIG. 1 about the pin 10a. By the operation lever 10 being rotated, the roller 11b of the drive lever 11 is downwardly depressed against the urging force of the coil spring S2, with the result that the drive lever 11 is rotated counterclockwise in FIG. 1 about the pin 11a.

Figure 19:
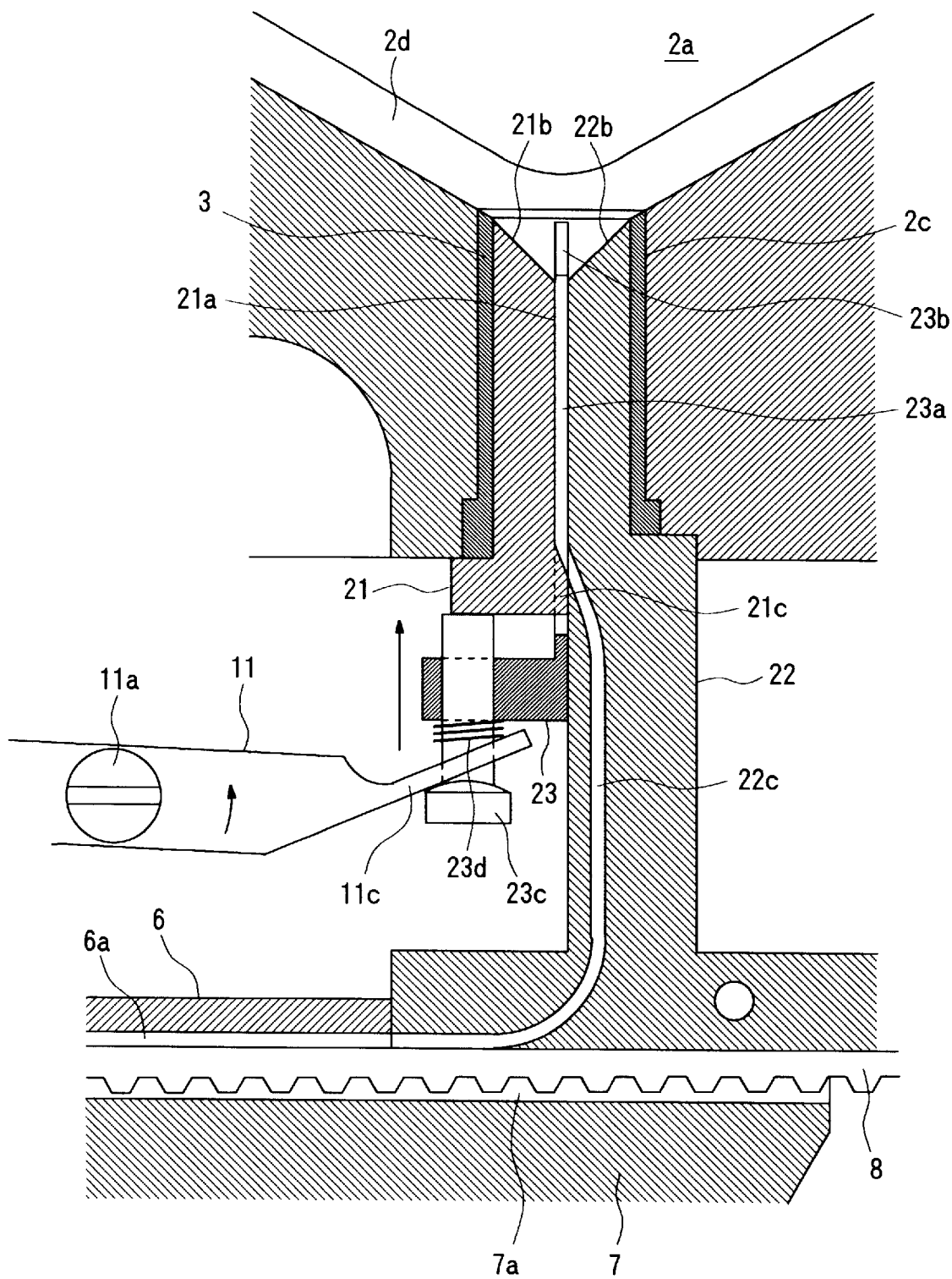
FIG. 19 is a view of operational illustration corresponding to FIG. 15.
Figure 20:
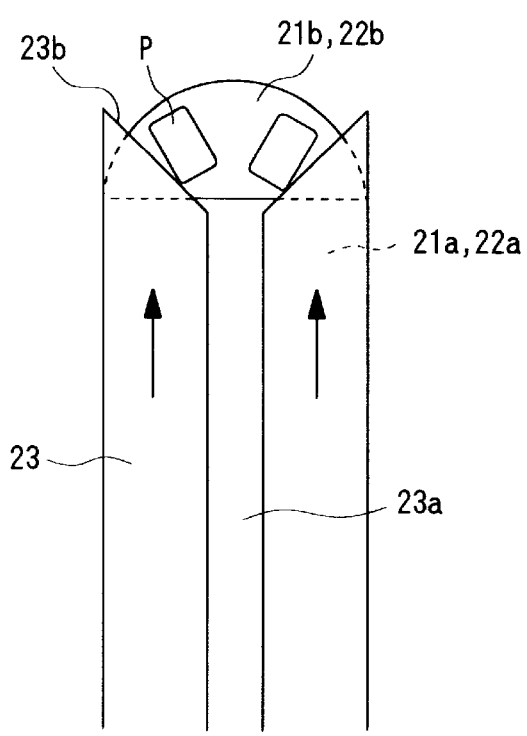
FIG. 20 is a view illustrating a component taking-in operation in the second embodiment.
Figure 20:
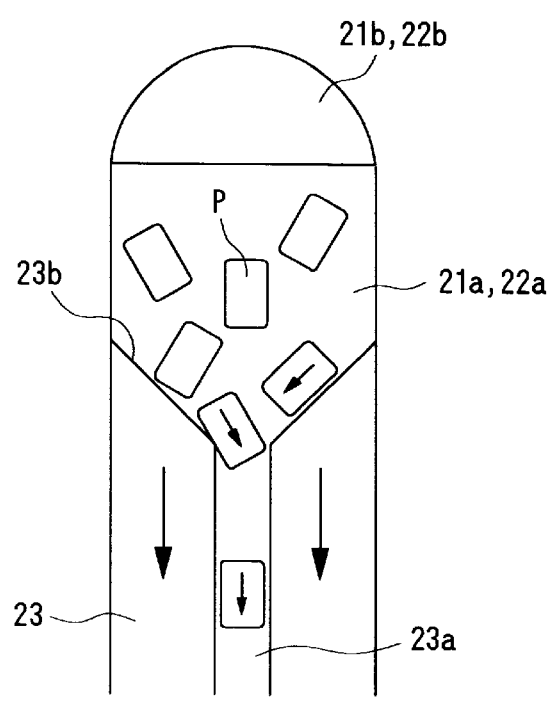

And, as illustrated in FIG. 19, by the engaging portion 11c of the drive lever 11, the spacer 23 is raised by a prescribed stroke from its lowered position. Specifically, the spacer 23 is raised until the upper end of the guiding surface 23b rises up to the same level as that of the upper ends of the guiding surface 21b, 22b of the first and second taking-in members 21, 22. The raised position of the spacer 23 is regulated by the upper end of the stopper pin 23c being abutted on the underside of the first taking-in member 21.

When releasing the downward depression of the movable end of the operation lever 10, the operation lever 10 and drive lever 11 are restored to the standby state by the urging forces of the springs and the spacer 23 also is lowered from its raised position and returned to the standby state.

In the process in which the spacer 23 is raised, as illustrated in FIG. 20(A), the chip components P that have theretofore been entered into the V-shaped space defined by the guiding surfaces of the first and second taking-in members 21, 22 are lifted upward, with the result that the stored components P are stirred. Also, in the process in which the spacer 23 is lowered, while being guided by the both guiding surfaces 21b and 22b defining a letter "V" toward the parallel space PS (see FIG. 15), the chip components P within the storage chamber 2a enter into the parallel space PS by being oriented in a prescribed direction, concretely in a direction in which the clearance of the parallel space PS and the thickness of the chip component P match with each other as illustrated in FIG. 20(B).

As illustrated in FIG. 20(B), the chip components P that have entered the parallel space PS are induced toward the supply passageway (the slit 23a) along the inclinations of the letter leading surfaces 23b, 23b and, in a state where the thicknesswise direction and the widthwise direction have coincided respectively, are entered lengthwise into the supply passageway on a one by one basis. Thereafter, the chip components P move downward within the supply passageway by their own weight. It is to be noted that if the boundary portion between the leading surface 23b and the slit 23a is rounded or chamfered, the taking of the components into the supply passageway can be more smoothly effected.

The rise and fall of the spacer 23 through the use of the operation lever 10 and drive Lever 11 are repeated each time the chip components P are conveyed to the component taking-out position by the belt 8 is taken out by an absorbing nozzle. Therefore, the chip components P within the storage chamber 2a repeatedly undergo the above-mentioned taking-in action.

The chip component P that has been taken into the supply passageway and moved downward by its own weight is transferred, in a state where the thicknesswise direction and the widthwise direction are in coincidence with each other, to the interior of the discharge passageway 22c of the second taking-in member 22 through the inclined projection 21c located on the lower side thereof. The chip components P that have been transferred to the interior of the discharge passageway 22c are moved further downwardly by its own weight in the discharge passageway 22c along the configuration thereof while being kept in said state. Then, after having its posture changed approximately 90 degrees from the lengthwise orientation to the lateral orientation, the chip component P is discharged from a terminating end of the discharge passageway 22c onto the surface of the belt 8 as in the case of the first embodiment.

The belt 8 is forwardly and intermittently moved in units of a prescribed distance, preferably a distance longer than the length of the chip component P, in conformity with the rise/fall operation of the spacer 23. Therefore, the chip component P that has been discharged from the discharge passageway 22c is forwardly moved jointly with the belt 8 in units of the same distance as mentioned above and is thereby conveyed up to the component taking-out position. Since the intermittent movement of the belt 8 is repeatedly made each time the chip component P is taken out, the chip components P arranged in succession within the discharge passageway 22c are discharged sequentially onto the surface of the belt 8 in a state of their being kept in the same posture and, while being drawn up in line by the straight groove 6a of the components guide 6, these chip components P are conveyed toward the component taking-out position in a state of their being arrayed in a row.

In this way, according to the second embodiment, by moving the spacer 23 sandwiched between the first taking-in member 21 and the second taking-in member 22 up and down in parallel with the both taking-in members 21 and 22, the prism-shaped chip components P stored in the storage chamber 2a in a bulk state can be caused to enter into the parallel space PS between the upper portions of the two taking-in members 21 and 22 in a state where the thicknesswise directions thereof are equally oriented. And, the chip components P that have been entered into the parallel space PS can be taken lengthwise into the supply passageway (the slit 23a) on a one by one basis in a state where the thicknesswise direction and the widthwise direction are made the same, whereby the components P can be moved downward by their own weight and, while they are being kept in said state, can be moved further downward by the discharge passageway 22c by their own weight.

Since the chip components P within the storage chamber 2a are caused to enter into the parallel space PS between the upper portions of the two taking-in members 21 and 22 in a state where the thicknesswise directions thereof are equally oriented and the chip components P that have been entered into the parallel space PS are taken lengthwise into the supply passageway (the slit 23a) one by one in a state where the thicknesswise direction and the widthwise direction are made the same, the probability that the prism-shaped chip components P will be taken with a prescribed posture into the supply passageway can be remarkably enhanced. As a result, the operation of supplying the prism-shaped components P stored within the storage chamber 2a in the state of their being oriented and arrayed in a prescribed direction can be performed stably and successively.

Incidentally, although in the second embodiment the first taking-in member 21 and second taking-in member 22 and the spacer 23 have been used, respectively, as the stationary side and the movable side, even when the both taking-in members 21, 22 are arranged to be moved up and down in parallel with the spacer 23 by the spacer 23 being fixed, it is possible to realize the same components taking-in operation as mentioned above.

Also, although in the second embodiment an arrangement has been illustrated wherein the first taking-in member 21 and the second taking-in member 22 are both disposed vertically so that the moving direction of the spacer 23 may be vertical, it may be arranged that as in the case of the arrangement illustrated in FIG. 14 the first taking-in member 21 and second taking-in member 22 are disposed on the lower side of the storage chamber 2a so that both of them may be inclined with respect to the vertical line to thereby make the moving direction of the spacer 23 define an acute angle with respect to the vertical line. In this case, even if no inclined guiding surface is provided in the taking-in member located on the upper side or each of the both taking-in members, it is possible to realize the same components taking-in operation as mentioned above.

As described above, although in each of the first and second embodiments and their modifications an arrangement has been illustrated as conforming to the prism-shaped chip components, column-shaped electronic components can also be handled instead of the prism-shaped electronic components and in this case the same functions and operations can be expected.

Also, although an arrangement has been illustrated which conveys the electronic components discharged from the discharge passageway to a destined position by the belt, it may be arranged that components are discharged onto a passageway that makes components conveyance by the use of the positive pressure or negative pressure of an air to thereby convey the discharged components to a destined position. Of course, in a case where directly taking out the electronic components discharged from the discharge passageway by an absorption nozzle or the like, the above-mentioned belt or conveyance mechanism using an air is unnecessary.

Further, in the first embodiment, in a case where using one of the taking-in members as the stationary side, this stationary side taking-in member may be previously formed integrally with the member constituting the storage housing 2. Further, in the second embodiment, in a case where using the two taking-in members as the stationary side, the both taking-in members may be previously formed integrally with the member constituting the storage housing 2.

The modes of embodiment that have been described in this specification are only illustrative and not limitative. The scope of the present invention is shown in the appended claims and all modifications that fall under the category of the claimed items are included in the present invention.

What is claimed is:

1. An electronic component supply apparatus, comprising:

a storage chamber for storing in a bulk state prism-shaped electronic components each having a prescribed width, thickness and length;

two taking-in members having upper ends directed to the interior of the storage chamber, said two taking-in members being disposed at a bottom portion of the storage chamber in a state where flat surfaces of the two taking-in members are in contact with each other and are relatively movable;

the flat surface of at least one of the taking-in members including a recessed portion, said recessed portion forming a parallel space between the upper portions of the two taking-in members at the time of movement of one of said taking-in members relative to the other of said taking-in members, said parallel space having a clearance determined by the depth of the recessed portion, the clearance throughout its length being larger than the thickness of one electronic component and smaller than the sum of the thicknesses of two of the electronic components, the parallel space having a width determined by the width of the recessed portion, the parallel space width being far greater than the width of one of the electronic components so several of the components can simultaneously be located in and across the width of the parallel space throughout its length; and the flat surface of at least one of the taking-in members including a groove, said groove forming a supply passageway between the two taking-in members so said groove communicates with the parallel space, said supply passageway having a rectangular cross section conforming to the configuration of an end surface of the electronic component.

2. The apparatus according to claim 1, wherein:

the two taking-in members are arranged so the relative movement thereof is vertical.

3. The apparatus according to claim 1, wherein:

the two taking-in members are arranged so the relative movement thereof is inclined at an angle to a vertical line.

4. The apparatus according to claim 1, wherein:

the parallel space is formed by the recessed portions formed respectively in the flat surfaces of the two taking-in members, and the supply passageway is formed by the grooves formed respectively in the flat surfaces of the two taking-in members.

5. The apparatus according to claim 1, wherein:

the parallel space is formed by the recessed portion formed in the flat surface of one of the two taking-in members, and the supply passageway is formed by the groove formed in the taking-in member having the recessed portion.

6. The apparatus according to claim 1, wherein:

the width of the parallel space is the same as the width of the flat surfaces of the two taking-in members.

7. The apparatus according to claim 1, wherein:

the interior of one of the two taking-in members includes a discharge passageway having a rectangular cross section confining to the configuration of the end surface of the electronic component as the discharge passageway communicates with the supply passageway.

8. The apparatus according to claim 1, wherein:

the clearance of the parallel space is approximately 1.2 times the thickness of the electronic component.

9. The apparatus according to claim 1, wherein:

the width of the supply passageway is approximately 1.2 times the width of the electronic component and the depth thereof is approximately 1.2 times the thickness of the electronic component.

10. The apparatus according to claim 1, wherein:

the upper end of the supply passageway includes a leading surface for inducing movement toward the supply passageway of an electronic component that is in the parallel space.

11. The apparatus according to claim 10, wherein:

a boundary portion between the leading surface and the supply passageway is rounded.

12. The apparatus according to claim 1, wherein:

one of the two taking-in members is stationary relative to the remainder of the apparatus and the other taking-in member is movable.

13. The apparatus according to claim 12, wherein:

the upper end position of the stationary side taking-in member is substantially co-planar with a bottom surface of the storage chamber.

14. The apparatus according to claim 12, wherein:

the upper end position of the movable taking-in member while it moves toward the storage chamber is substantially co-planar with the bottom surface of the storage chamber.

15. The apparatus according to claim 1, wherein:

each of the two taking-in members includes an upper end with a guiding surface for inducing movement of the electronic component in the storage chamber toward the parallel space.

16. The apparatus according to claim 15, wherein:

each of the guiding surfaces includes an inclined surface, the guiding surfaces together having a shape forming the letter V.

17. The apparatus according to claim 16, wherein:

the angle between the guiding surfaces forming the letter V is in a range of from 45 to 120 degrees.

18. The apparatus according to claim 10, wherein:

the leading surface includes two inclined surfaces together having a V shape.

19. The apparatus according to claim 18, wherein:

the leading surface gas an upper end located at a position lower than the upper end of the parallel space.

20. The apparatus according to claim 18, wherein:

the upper end of the leading surface is in the same plane as the upper end of the parallel space.

21. The apparatus according to claim 18, wherein:

the V shaped angle of the leading surface has an apex in a range of from 45 to 120 degrees.

22. An electronic component supply apparatus, comprising:
  a storage chamber for storing in a bulk state prism-shaped electronic components each having a prescribed width, thickness and length;
  two taking-in members having upper ends directed to the interior of the storage chamber, said two taking-in members being disposed at a bottom portion of the storage chamber in a state where flat surfaces thereof oppose each other through a gap therebetween, the flat surfaces being parallel with each other;
  a spacer disposed relatively movably with respect to and between the flat surfaces of the two taking-in members, said spacer and the flat surfaces forming a parallel space between the upper portions of the two taking-in members at the time of relative movement between the spacer and the two taking-in members, the spacer being pinched between the two taking-in members, said parallel space having a clearance determined by the thickness of the spacer, the clearance throughout its length being larger than the thickness of one electronic component and smaller than the sum of the thicknesses of two of the electronic components, the parallel space having a width determined by the widths of the flat surfaces, the parallel space width being far greater than the width of one of the electronic components so several of the components can simultaneously be located in and across the width of the parallel space throughout its length; and
  the spacer including a slit forming a supply passageway between the two taking-in members so the slit communicates with the parallel space, said supply passageway having a rectangular cross section conforming to the configuration of an end surface of the electronic component.

23. The apparatus accord g to claim 22, wherein:
  the movement of the spacer relative to the two taking-in members is vertical.

24. The apparatus according to claim 22, wherein:
  the movement of the spacer relative to the two taking-in members is inclined at an acute angle to a vertical line.

25. The apparatus according to claim 22, wherein:
  the width of the spacer is the same as the width of the flat surfaces of the two taking-in members.

26. The apparatus according to claim 22, wherein:
  the interior of one of the two taking-in members includes a discharge passageway having a rectangular cross section conforming to the configuration of the end surface of the electronic component so the discharge passageway communicates with the supply passageway.

27. The apparatus according to claim 22, wherein:
  the clearance of the parallel space is approximately 1.2 times the thickness of the electronic component.

28. The apparatus according to claim 22, wherein:
  the width of the supply passageway is approximately 1.2 times the width of the electronic component and the depth thereof is approximately 1.2 times the thickness of the electronic component.

29. The apparatus according to claim 22, wherein:
  each of the two taking-in members includes an upper end with a guiding surface for inducing movement of the electronic component in the storage chamber toward the parallel space.

30. The apparatus according to claim 29, wherein:
  each of the guiding surfaces includes an inclined surface, the guiding surfaces together having a shape forming the letter V.

31. The apparatus according to claim 30, wherein:
  the angle between the guiding surfaces forming the letter V is in a range of from 45 to 120 degrees.

32. The apparatus according to claim 22, wherein:
  the spacer includes an upper end toward the supply passageway with a leading surface for inducing movement of an electronic component in the parallel space toward the supply passageway.

33. The apparatus according to claim 32, wherein:
  a boundary portion between the leading surface and the supply passageway is rounded.

34. The apparatus according to claim 32, wherein:
  the leading surface includes two inclined surfaces having a V shape.

35. The apparatus according to claim 34, wherein:
  the V shaped angle of the leading surface is in a range of from 45 to 120 degrees.

36. An apparatus for feeding electronic components having substantially the same known dimensions to an outlet, the apparatus comprising:
  a storage chamber for storing the components in a bulk state so the components when stored in the chamber abut a lower surface of the chamber, first and second taking-in members, at least one of said first and second taking-in members having an upper end in close proximity to the lower surface;
  a guide arrangement for guiding the components in the chamber to an elongated passage having a rectangular cross-section dimensioned so that only one of the components can fit lengthwise at any particular time in a particular cross-section of the passage;
  the guide arrangement including a structure translatable toward and away from the chamber lower surface and relative to the second taking-in member, the structure and second taking-in member having contacting flat surfaces that move relative to each other as said structure translates relative to the second taking-in member, the passage being formed between the contacting flat surfaces, so that at least a portion of the passage translates toward and away from the chamber lower surface as the structure translates toward and away from the chamber lower surface;
  the guide arrangement including a first flat surface at the upper end of one of said taking-in members, the first flat surface extending vertically and horizontally between the storage chamber and a flat wall surface of said one taking-in member for causing the components to move by gravity in a funnel-like manner from the chamber toward an entrance of the passage, the first flat surface having a lower edge intersecting the flat wall surface of said one taking-in member, a volume including the first flat surface and the lower edge as boundaries being such that a plurality of the components can simultaneously be located in the volume, the volume being arranged for causing the components to move by gravity in a funnel-like maimer through the volume, the flat wall surface of said one taking-in member lying in the same plane as a wall of the passage and extending in a plane parallel to the contacting surfaces, the guide arrangement including second and third flat surfaces (a) extending between the flat wall surface of said one taking-in member and the contacting flat surface of said one taking-in member and (b) being inclined horizontally and vertically, the vertical inclination of the second and third flat surfaces extending in a direction between the lower edge of the first flat surface and the entrance to the passage, the horizontal inclination of the second and third flat surfaces extending in a direction between opposite exterior edges of the flat wall surface and the entrance to the passage;

the lower edge, the second and third flat surfaces, the flat wall surface and the passage entrance being arranged such that the components can move by gravity in a funnel-like manner from the lower edge to the passage entrance; the first, second and third flat surfaces and the flat wall surface being such that the direction of the funnel-like action between the chamber lower surface and the lower edge is generally perpendicular to the direction of the funnel-like action between the lower edge and the passage entrance.

37. The apparatus of claim 36 wherein the upper end of said second taking-in member includes a flat surface, the first and fourth flat surfaces extending vertically and horizontally between the storage chamber and the flat wall surface of said one taking-in member.

38. The apparatus of claim 36 wherein the passage is arranged so the components move vertically through the passage.

39. The apparatus of claim 36 wherein the second and third surfaces have upper edges that are at approximately the same position as the upper edge of the first surface when the structure is at its closest position to the chamber bottom surface.

40. The apparatus of claim 36 wherein the structure comprises the first taking-in member.

41. The apparatus of claim 40 wherein the passage includes matching grooves in abutting surfaces of the first and second taking-in members.

42. The apparatus of claim 36 wherein the structure comprises a guide plate between opposing faces of the first and second taking-in members, the passage including a slot in the guide plate.

43. The apparatus of claim 42 wherein the first and second taking-in members are stationary relative to the chamber lower surface.

44. The apparatus of claim 36 wherein the passage is arranged so the components move vertically and horizontally through the passage.

45. The apparatus of claim 44 wherein the upper end of the second taking-in member includes a fourth flat surface that extends in a tapered manner between the chamber bottom surface and the bottom edge, and the first taking-in member upper portion in close proximity to the chamber lower surface includes a flat surface that extends substantially at right angles to the direction the components move through the passage.

46. The apparatus of claim 36 wherein the structure includes the first taking-in member, the first taking-in member including corresponding surfaces configured the same as and having the same relative position as the first, second and third surfaces of the second taking-in member, first second and third surfaces of the second taking-in members and the corresponding surfaces of the first taking-in members being in registration while the first and second taking-in members are at the closest position to the chamber bottom surface.

47. The apparatus of claim 46 wherein the structure comprises the first taking-in member.

* * * * *